US008922471B2

(12) United States Patent
Chung

(10) Patent No.: US 8,922,471 B2
(45) Date of Patent: Dec. 30, 2014

(54) DRIVER AND DISPLAY DEVICE USING THE SAME

(75) Inventor: Bo-Yong Chung, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 263 days.

(21) Appl. No.: 13/011,032

(22) Filed: Jan. 21, 2011

(65) Prior Publication Data

US 2012/0038609 A1 Feb. 16, 2012

(30) Foreign Application Priority Data

Aug. 11, 2010 (KR) ........................ 10-2010-0077362

(51) Int. Cl.
*G09G 3/36* (2006.01)
*G11C 19/00* (2006.01)
*G09G 3/00* (2006.01)
*G09G 3/32* (2006.01)

(52) U.S. Cl.
CPC .............. *G09G 3/003* (2013.01); *G09G 3/3266* (2013.01); *G09G 3/3674* (2013.01); *G09G 2310/0286* (2013.01); *G09G 2310/0291* (2013.01); *G09G 2310/061* (2013.01); *G09G 2310/063* (2013.01); *G09G 2310/08* (2013.01)
USPC ............................................... 345/98; 377/78

(58) Field of Classification Search
CPC . G09G 3/3688; G09G 3/3677; G09G 3/3266; G09G 2310/0286; G09G 3/3674; G09G 2310/028; G09G 2310/0291
USPC ........ 315/161, 169.1, 169.2, 169.3, 185, 299; 326/46; 327/108, 168, 387, 389, 391; 345/76, 82, 98, 99, 100, 204, 206, 211, 345/212, 213, 690; 348/801; 377/64, 78
See application file for complete search history.

(56) References Cited

U.S. PATENT DOCUMENTS 7,623,097 B2 * 11/2009 Chung ............................ 345/76
2002/0190326 A1 * 12/2002 Nagao et al. .................. 257/359
2005/0116656 A1 * 6/2005 Shin ........................... 315/169.3
2006/0022912 A1 * 2/2006 Park et al. ....................... 345/76
2006/0202940 A1 * 9/2006 Azami et al. .................. 345/100
2007/0040771 A1 * 2/2007 Chung et al. .................... 345/76
2007/0127620 A1 * 6/2007 Moon et al. ..................... 377/64

FOREIGN PATENT DOCUMENTS

KR 10-2006-0099597 9/2006
KR 10-0658270 12/2006
KR 10-2007-0022550 2/2007
KR 10-2008-0027062 3/2008
KR 10-0830296 * 3/2008 ............... G09G 3/30

* cited by examiner

*Primary Examiner* — Michael J Eurice
(74) *Attorney, Agent, or Firm* — Robert E. Bushnell, Esq.

(57) ABSTRACT

A driving device comprises: a first driver driven by a first input signal and generating a first interim output signal controlled by a first clock signal; a second driver driven by a second input signal and generating a second interim output signal controlled by a second clock signal; and a plurality of shift registers including a buffer driven by the first interim output signal and the second interim output signal and generating an output signal controllable by the first clock signal and the second clock signal. The buffer includes a second transistor connected to a gate electrode of a first transistor for transmitting a voltage with a first level with the output signal and transmitting a voltage with a second level for turning off the first transistor.

45 Claims, 12 Drawing Sheets

DRIVER AND DISPLAY DEVICE USING THE SAME

CLAIM OF PRIORITY

This application makes reference to, incorporates the same herein, and claims all benefits accruing under 35 U.S.C. §119 from an application entitled DRIVER AND DISPLAY DEVICE USING THE SAME earlier filed in the Korean Intellectual Property Office on Aug. 11, 2010, and there duly assigned Serial No. 10-2010-0077362 by that Office.

BACKGROUND OF THE INVENTION

1. Field of the Invention

The present invention relates to a driving device and a display device using the same. More particularly, the present invention relates to a driving device applicable to a sequential light emitting driving method and a concurrent light emitting driving method of a display device, operable in a circuit with a built-in thin film transistor having a large off current to generate a driving signal, and simplifying an interface by using 2-phase clock signals, and a display device using the same.

2. Description of the Related Art

Recently, various flat panel displays that are capable of reducing weight and volume that are disadvantages of a cathode ray tube have been developed. As the flat panel displays, there are a liquid crystal display (LCD), a field emission display (FED), a plasma display panel (PDP), an organic light emitting diode (OLED) display, and the like.

Among the flat panel displays, the organic light emitting diode display, which displays images by using the organic light emitting diode (OLED) that generates light by recombining electrons and holes, has a fast response speed, is driven with low power consumption, and has excellent emission efficiency, luminance, and viewing angle, such that it has recently been in the limelight.

In the flat panel display, a plurality of pixels are disposed in a matrix form on a substrate to form a display panel, and scan lines and data lines are connected to the respective pixels to selectively transmit data signals to the pixels and display the signals by controlling light emission by a light emission control signal transmitted through a light emission control line connected to each pixel.

Recently, as display panels have increased in size, screen quality of a sharp, high picture quality has been required, and research and development of a light emission control driver that can be able to control light emission of flat panel displays for providing sharp picture quality and implementing a three-dimensional (3D) video display has been required in line with the trend that 3D stereoscopic image displays are taking hold.

Therefore, a driving device applicable to realization of a display of various light emitting methods, improving a yield of a built-in circuit, and simplifying an interface to avoid complexity of the circuit is required.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a driving device that is operable selectively and variously corresponding to a concurrent or sequential light emitting method of a display device, improving image quality, and improving realization of displaying of 3D stereoscopic images.

The present invention has been made in another effort to develop a circuit of a driving device applicable to a single MOS process of a PMOS transistor or an NMOS transistor, and to provide a driving device operable in a thin film transistor circuit with a large off current to improve a yield of a built-in circuit, and a display device including the same.

The present invention has been made in another effort to provide a driving device for freely controlling a duty ratio of a driving signal, be realizable with various timings, and available for overlapping driving.

The technical problems to be achieved by the present invention are not limited to the above-mentioned technical problems, and therefore other technical problems can be clearly understood by those skilled in the art to which the present invention pertains from the following description. An exemplary embodiment of the present invention provides a driving device including: a first driver driven by a first input signal and generating a first interim output signal controlled by a first clock signal; a second driver driven by a second input signal and generating a second interim output signal controlled by a second clock signal; and a plurality of shift registers including a buffer driven by the first interim output signal and the second interim output signal and generating an output signal controllable by the first clock signal and the second clock signal.

The buffer includes a second transistor connected to a gate electrode of a first transistor for transmitting a voltage with a first level with the output signal and transmitting a voltage with a second level for turning off the first transistor.

The buffer further includes a third transistor connected to the gate electrode of the first transistor and transmitting a voltage with a level that is less than the level of the first level.

Another embodiment of the present invention provides a driving device including a buffer including a third transistor connected to a gate electrode of a first transistor for transmitting a voltage with a first level as the output signal, and transmitting a voltage with a level that is less than the voltage of the first level.

The first level is a low level applied by a low-potential power source voltage.

The buffer includes: a first transistor connected to an output terminal for outputting the output signal and transmitting a voltage with a first level as the output signal when it is turned on, and a fourth transistor connected to the output terminal and transmitting a voltage with a second level as the output signal when it is turned on.

The second level represents a high level applied by a high-potential power source voltage.

A voltage level transmitted by the third transistor is less than the first level by at least twice a threshold voltage of the first transistor.

The output signal is output to be a voltage with an inverted level when the first interim output signal is a gate on voltage level, and it is output to be a voltage with a corresponding level when the second interim output signal is a gate on voltage level.

A voltage level of the output signal is inverted when the first interim output signal is transmitted with a gate on voltage level to the buffer, and it is re-inverted when the second interim output signal is transmitted with the gate on voltage level to the buffer.

The output signal is controlled by a pulse width or a period of the first clock signal and the second clock signal.

A time when the voltage level of the output signal is inverted is synchronized when the first input signal is transmitted with the gate on voltage level and a first interim output signal is generated in correspondence to a gate on voltage level pulse of the first clock signal, or when the second input signal is transmitted with the gate on voltage level and a second interim output signal is generated in correspondence to a gate on voltage level pulse of the second clock signal.

The first driver and the second driver receive at least two clock signals that are 2-phase clock signals of which phase difference thereof is inverted.

The first driver includes: a first switch controllable by the first clock signal and a first clock bar signal of which the phase difference of the first clock signal is inverted, and transmitting a voltage caused by a voltage level of the first input signal to a first node; a second switch controllable by the first input signal and transmitting a first power source voltage to a second node; a third switch controllable in correspondence to the voltage transmitted to the first node, and transmitting a voltage caused by the voltage level of the first clock signal with a voltage level of the first interim output signal; a fourth switch controllable in correspondence to the voltage transmitted to the second node and transmitting the first power source voltage with a voltage level of the first interim output signal; a first capacitor for storing the voltage transmitted to the first node; and a second capacitor for storing the voltage transmitted to the second node.

The first driver further includes a fifth switch controllable by a first control signal and transmitting a second power source voltage with a level that is less than that of the first power source voltage to the second node.

The first driver further includes at least one sixth switch controllable by the second power source voltage transmitted to the second node and transmitting the first power source voltage to the first node.

The first control signal represents a first interim output signal generated by a shift register of a next stage.

The second driver includes: a seventh switch controllable by the second clock signal and a second clock bar signal of which a phase difference is inverted, and transmitting a voltage caused by a voltage level of the second input signal to the third node; an eighth switch controllable by the second input signal, and transmitting a first power source voltage to a fourth node; a ninth switch controllable in correspondence to the voltage transmitted to the third node, and transmitting a voltage caused by a voltage level of the second clock signal with a voltage level of the second interim output signal; a tenth switch controllable in correspondence to the voltage transmitted to the fourth node, and transmitting the first power source voltage with a voltage level of the second interim output signal; a third capacitor for storing the voltage transmitted to the third node; and a fourth capacitor for storing the voltage transmitted to the fourth node.

The second driver further includes an eleventh switch controllable by a second control signal, and transmitting a second power source voltage with a level that is less than that of the first power source voltage to the fourth node.

The second driver further includes at least one twelfth switch controllable by the second power source voltage transmitted to the fourth node, and transmitting the first power source voltage to the third node.

The second control signal is a second interim output signal generated by a shift register of a next stage.

The buffer includes: a thirteenth switch controllable by the first interim output signal, and transmitting a voltage of the second level to the first transistor; a fourteenth switch controllable by the first interim output signal, and transmitting a voltage of the first level to the second transistor and the fifteenth switch; a fifteenth switch controllable by the transmitted voltage of the first level, and transmitting a voltage of the second level to the output signal; a sixteenth switch controllable by the second interim output signal, and transmitting a voltage with a level that is less than the voltage of the first level to the first transistor and the seventeenth switch; a seventeenth switch controllable by a voltage with a level that is less than the voltage of the first level, and transmitting the voltage of the second level to the fifteenth switch; a fifth capacitor for storing the voltage transmitted to the gate electrode of the first transistor; and a sixth capacitor for storing the voltage transmitted to the gate electrode of the fifteenth switch.

The first transistor is switched in response to a voltage with a level that is less than the voltage of the second level or the first level, and it outputs the voltage of the first level with the output signal.

The buffer includes: a thirteenth switch controllable by the first interim output signal, and transmitting a voltage of the second level to the first transistor; a fourteenth switch controllable by the first interim output signal, and transmitting a voltage of the first level to the second transistor and the fifteenth switch; a fifteenth switch controllable by the transmitted voltage of the first level, and transmitting a voltage of the second level to the output signal; a sixteenth switch controllable by a voltage with the first level transmitted to the fifteenth switch, and transmitting the first power source voltage to the first transistor; a seventeenth switch controllable by a voltage with a level that is less than the voltage of the first level, and transmitting the voltage of the second level to the fifteenth switch; a fifth capacitor for storing the voltage transmitted to the gate electrode of the first transistor; and a sixth capacitor for storing the voltage transmitted to the gate electrode of the fifteenth switch.

The first transistor is switched in response to a voltage with a level that is less than the voltage of the second level or the first level, and it outputs the voltage of the first level with the output signal, and the third transistor is controllable by the second interim output signal, and transmits a voltage with a level that is less than the voltage with the first level to the first transistor and the seventeenth switch.

The first interim output signal is transmitted with a first input signal of a shift register of a next stage, and the second interim output signal is transmitted with a second input signal of a shift register.

The buffer further includes: a first driving switch for transmitting the voltage with the second level to the gate electrode of the first transistor when it is turned on in response to the first drive control signal; and a second driving switch for transmitting the voltage with the first level to the gate electrode of the second transistor when it is turned on in response to the first drive control signal.

While the first drive control signal is transmitted with the gate on voltage level, the first driving switch and the second driving switch are turned on and the buffer generates the voltage with the second level as an output signal.

The buffer further includes: a first driving switch for transmitting the voltage with the second level to the gate electrode of the first transistor when it is turned on in response to the first drive control signal; a second driving switch for transmitting the voltage with the first level to the gate electrode of the second transistor when it is turned on in response to the first drive control signal; a third driving switch for transmitting the voltage with the second level to the gate electrode of the second transistor when it is turned on in response to the second drive control signal; and a fourth driving switch for transmitting a voltage with a level that is less than the voltage with the first level to the gate electrode of the first transistor when it is turned on in response to the second drive control signal.

While the first driver and the second driver of the driving device are turned off, when the first drive control signal is applied with the gate on voltage level, the first driving switch and the second driving switch are turned on and the buffer generates the voltage with the second level as an output signal, and when the second drive control signal is applied with the gate on voltage level, the third driving switch and the fourth driving switch are turned on and the buffer generates the voltage with the first level as an output signal.

Circuit elements for configuring the first driver, the second driver, and the buffer are a plurality of transistors, and the plurality of transistors are realized with PMOS transistors or NMOS transistors.

Yet another embodiment of the present invention provides a display device including: a display including a plurality of pixels respectively connected to a plurality of scan lines for transmitting a plurality of scan signals, a plurality of data lines for transmitting a plurality of data signals, and a plurality of light emission control lines for transmitting a plurality of light emission control signals; a scan driver for generating the scan signal and transmitting it to a corresponding scan line from among the plurality of scan lines; a data driver for transmitting the data signal to the plurality of data lines; and a light emission control driver for generating the light emission control signal and transmitting it to a corresponding light emission control line from among the plurality of light emission control lines.

The scan driver or the light emission control driver includes: a first driver driven by the first input signal and generating a first interim output signal controlled by a first clock signal; a second driver driven by the second input signal and generating a second interim output signal controlled by the second clock signal; and a plurality of shift registers including a buffer driven by the first interim output signal and the second interim output signal and generating an output signal controlled by the first clock signal and the second clock signal.

The buffer is connected to a gate electrode of the first transistor for transmitting a voltage with a first level as the output signal, and includes a second transistor for transmitting a voltage with a second level for turning off the first transistor.

The buffer further includes a third transistor connected to the gate electrode of the first transistor and transmitting a voltage with a level that is less than the voltage with the first level.

Yet another embodiment of the present invention provides a display device including a buffer connected to a gate electrode of the first transistor for transmitting a voltage with a first level as the output signal and including a third transistor for transmitting a voltage with a level that is less than the voltage of the first level, the buffer configuring the scan driver or the light emitting control driver.

According to the display device of the present invention, a light emission control driver for generating a light emission control signal variable according to a concurrent light emitting mode or a sequential light emitting mode of a display can be provided.

According to an embodiment of the present invention, a driving device operable selectively and variously corresponding to a light emitting method of a display device by controlling a circuit configuration of a driving device and timing of a driving signal is provided to improve image quality and also improve realization of displaying of 3-dimensional (3D) stereoscopic images.

According to a driving device of the embodiment of the present invention, a display device can be driven by generating a driving signal for freely controlling a duty ratio and realizing various timings. Further, a yield of a driver in a display device is improved since it is operable in a thin film transistor circuit with a large off current, and a driving circuit with a simplified interface is provided by using 2-phase clock signals.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
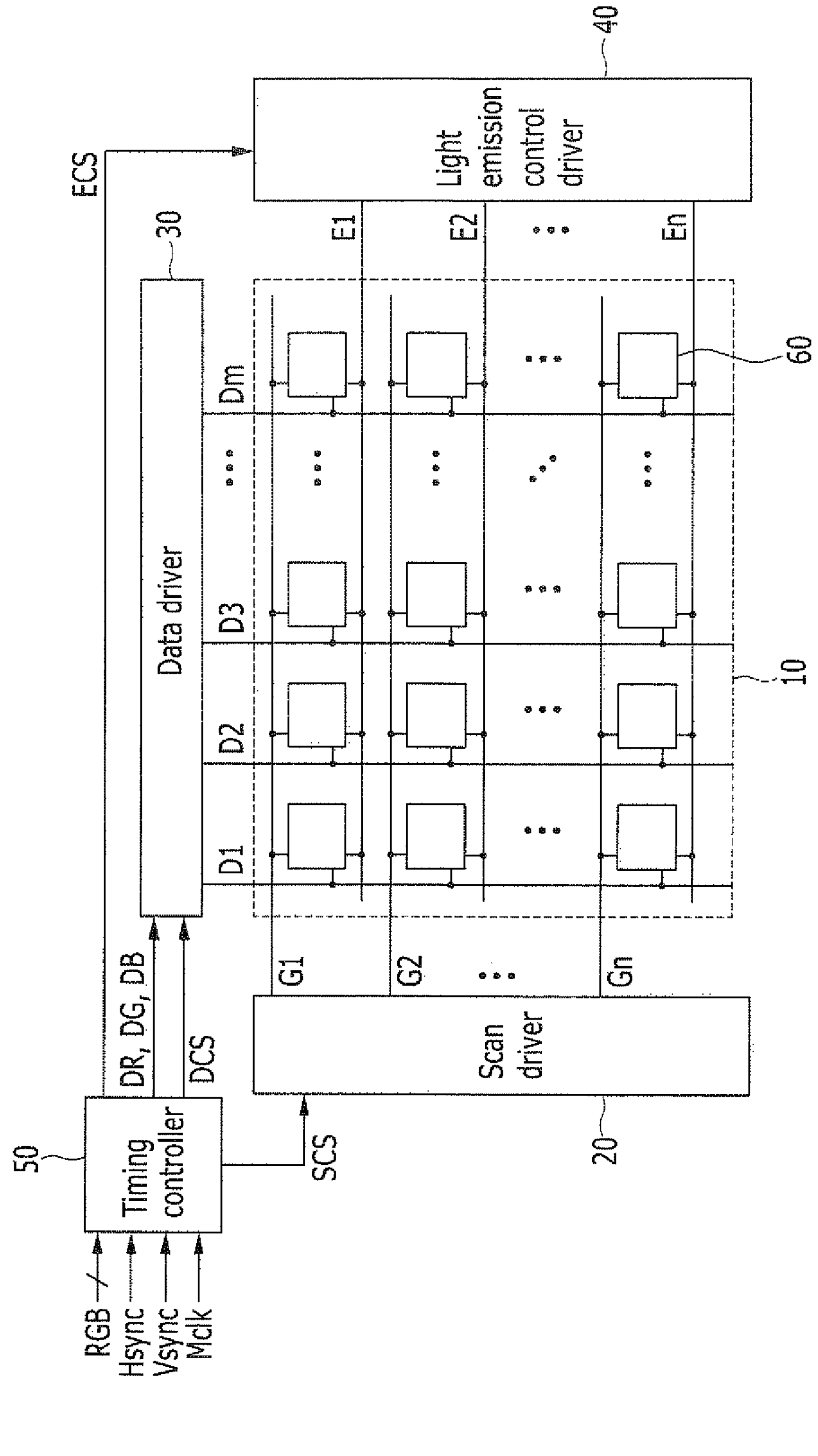
FIG. 1 shows a block diagram of a display device according to an exemplary embodiment of the present invention.

Hereinafter, the present invention will be described more fully with reference to the accompanying drawings, in which exemplary embodiments of the invention are shown. As those skilled in the art would realize, the described exemplary embodiments may be modified in various different ways, all without departing from the spirit or scope of the present invention.

Further, like reference numerals denotes like components throughout several exemplary embodiments. A first exemplary embodiment will be representatively described, and therefore only components other than those of the first exemplary embodiment will be described in other exemplary embodiments.

The drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

FIG. 1 shows a block diagram of a display device according to an exemplary embodiment of the present invention.

Referring to FIG. 1, the display device includes a display 10, a scan driver 20, a data driver 30, a light emission control driver 40, and a timing controller 50. The display device includes driving devices according to an exemplary embodiment of the present invention including the scan driver 20 and the light emission control driver 40.

The display device is a flat panel display including a liquid crystal display (LCD) and an organic light emitting diode (OLED) display.

The driving device represents a device for generating a driving signal that is a pulse with a predetermined period for controlling the display device and transmitting the same, and it is not restricted to the devices such as the scan driver or the light emission control driver.

In FIG. 1, the scan driver 20 for generating a scan signal for selecting and operating the pixel 60 of the display 10 of the display device and transmitting the same to the display 10 and the light emission control driver 40 for generating a light emission control signal for controlling light emission of the pixel 60 and transmitting the same to the display 10 configure the driving device including the driving circuit according to the embodiment of the present invention.

The display 10 includes a plurality of pixels 60 each connected to a corresponding scan line from among a plurality of scan lines (G1 to Gn), a corresponding light emission control line from among a plurality of light emission control lines (E1 to En), and a corresponding data line from among a plurality of data lines (D1 to Dm) in an area where the plurality of scan lines (G1 to Gn), the plurality of light emission control lines (E1 to En), and the plurality of data lines (D1 to Dm) cross each other.

The plurality of pixels 60 of the display 10 are arranged in a matrix form. The plurality of scan lines for transmitting the scan signal and the plurality of light emission control lines for transmitting a light emission control signal are arranged in a row direction and are in parallel with each other in the arranged form of the pixels 60, and the plurality of data lines are arranged in a column direction and are parallel with each other.

When the display device according to an exemplary embodiment of the present invention is an organic light emitting diode (OLED) display, the plurality of pixels 60 included in the display 10 respectively include a driving transistor and an organic light emitting diode (OLED). In this instance, a pixel 60 is selected from among the plurality of pixels included in the display 10 by the scan signal that is transmitted through the corresponding scan line from among the plurality of scan lines (G1 to Gn), and a driving transistor included in the pixel 60 receives a data voltage caused by a data signal transmitted through the corresponding data line from among the plurality of data lines (D1 to Dm), and supplies a current caused by the data voltage to the organic light emitting diode (OLED) to emit it with the light of predetermined luminance. In this instance, light emission of the organic light emitting diode (OLED) of the pixel 60 is controlled by controlling the current to flow to the organic light emitting diode (OLED) by a light emission control signal that is transmitted through the light emission control line from among the plurality of light emission control lines (E1 to En).

Therefore, a circuit configuration of the driving device according to an exemplary embodiment of the present invention and a driving waveform for driving the same are applied to the scan driver 20 or the light emission control driver 40 of FIG. 1. A detailed driving device according to an exemplary embodiment of the present invention will be described with reference to FIG. 2.

Referring to FIG. 1, the scan driver 20 connected to a plurality of scan lines (G1 to Gn) generates a scan signal and transmits it to a plurality of scan lines (G1 to Gn). A predetermined row from among a plurality of pixel rows of the display 10 is selected by the scan signal, and a data signal is transmitted through data lines connected to a plurality of pixels.

The data driver 30 connected to a plurality of data lines (D1 to Dm) generates a data signal and sequentially transmits the data signal to a plurality of pixels included in a row of a plurality of pixel rows of the display 10 through a plurality of data lines (D1 to Dm).

The light emission control driver 40 connected to a plurality of light emission control lines (E1 to En) generates a light emission control signal and transmits it to a plurality of light emission control lines (E1 to En). The light emission control driver 40 controls a pulse width of the light emission control signal by the light emitting driving control signal transmitted by the timing controller 50. Also, the light emission control driver 40 controls the light emitting method of the display 10 to be realized as the concurrent light emitting mode or the sequential light emitting mode if needed by equivalently controlling respective pulse voltage levels of the light emission control signals that are transmitted to a plurality of pixels included in a plurality of pixel rows or controlling them to be sequentially changed.

The pixel 60 connected to the light emission control lines (E1 to En) receives the light emission control signal to determine a time for the current generated by the pixel 60 to flow to the organic light emitting diode (OLED). In this instance, the light emission control driver 40 is realizable by a PMOS transistor or an NMOS transistor, and it can be formed on a substrate without an additional process when the display 10 is formed or it can be formed as a separate chip.

The timing controller 50 uses a horizontal synchronization signal (Hsync), a vertical synchronization signal (Vsync), and a clock signal (MCLK) to generate a driving control signal for controlling driving of the scan driver 20, the data driver 30, and the light emission control driver 40. That is, a data driving control signal (DCS) generated by the timing controller 50 is supplied to the data driver 30, and a scan driving control signal (SCS) is supplied to the scan driver 20. Also, a light emitting driving control signal (ECS) is supplied to control an output waveform of the light emission is control signal generated by the light emission control driver 40.

The timing controller 50 also receives a video signal (RGB) and in response thereto, supplies digital video data (DR, DG and DB) to the data driver 30.

Figure 2:
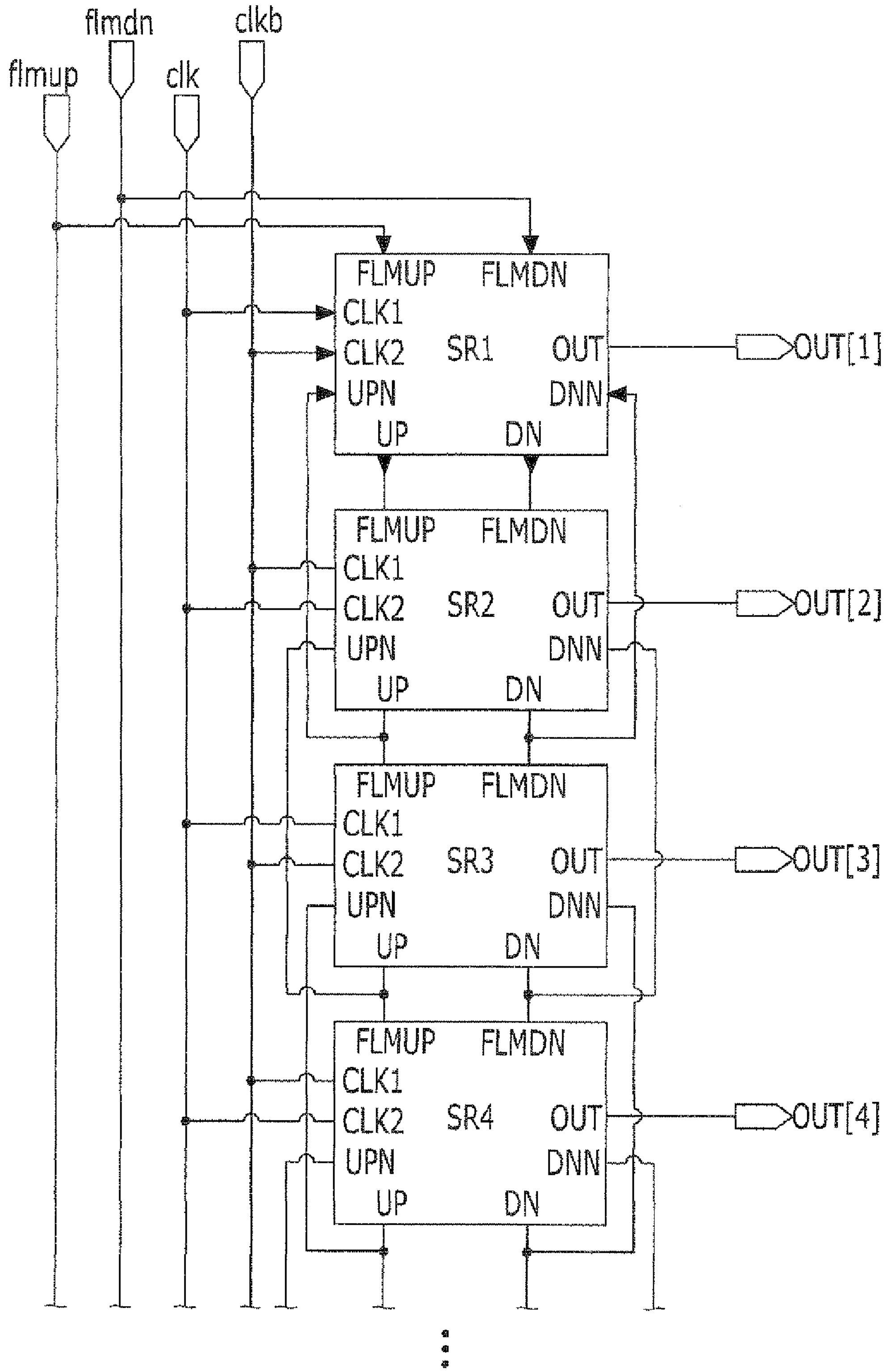
FIG. 2 shows a block diagram of one of a scan driver and a light emission control driver shown in FIG. 1 according to an exemplary embodiment of the present invention.

FIG. 2 shows a block diagram of one of a scan driver and a light emission control driver shown in FIG. 1 according to an exemplary embodiment of the present invention. It shows that a driving device according to an exemplary embodiment of the present invention is applied to a scan driver 20 for generating a scan signal or the light emission control driver 40 for generating a light emission control signal. Constituent elements for sequentially generating a driving signal for controlling various display devices are applicable to the driving device.

Since the driving device shown in FIG. 2 is applicable to the scan driver 20 or the light emission control driver 40 of FIG. 1, it will be called a driving device hereinafter.

The driving device shown in FIG. 2 includes a plurality of shift registers (SR) connected to a plurality of outputs lines.

The shift registers (SR) respective include 6 input terminals and 3 output terminals.

Although not shown in the block diagram of FIG. 2, in detail, the shift registers (SR) respectively include a first driver and a second driver for transmitting input signals and a buffer for generating an output signal.

A detailed configuration of the driving device will be described later with reference to FIGS. 3A and 3B.

Each shift register (SR) includes a first input signal terminal (FLMUP) for receiving a start signal or a predetermined signal from a shift register of the previous stage, a second input signal terminal (FLMDN) for receiving a start signal or a predetermined signal from a shift register of the previous stage, a first clock signal terminal CLK1 for receiving a first clock signal, a second clock signal terminal CLK2 for receiving a second clock signal, a first control signal terminal (UPN) for receiving a predetermined signal from a shift register of the next stage, and a second control signal terminal (DNN) for receiving a predetermined signal from a shift register of the next stage.

Also, each shift register (SR) includes a first interim output signal terminal (UP) for generating a predetermined interim output signal and outputting the same, a second interim output signal terminal (DN) for generating another predetermined interim output signal and outputting the same, and an output signal terminal (OUT) for generating an output signal of a final shift register of the corresponding stage and transmitting the same.

In detail, the first input signal terminal (FLMUP) is driven by a start signal (flmup) in the case of the shift register SR1 of the first stage. The first input signal terminals (FLMUP) of the shift registers (SR2, SR3, SR4 . . . ) of other stages are driven by the first interim output signal transmitted by the first interim output signal terminal (UP) of the shift register of the previous stage.

Also, the second input signal terminal (FLMDN) is driven by another start signal (flmdn) in the case of the shift register SR1 of the first stage. The second input signal terminals (FLMDN) of the shift registers (SR2, SR3, SR4 . . . ) of the other stages are operable by the second interim output signal transmitted by the second interim output signal terminal (DN) of the shift register of the previous stage.

In the driving device according to an exemplary embodiment of the present invention, the first clock signal or the second clock signal is transmitted to the first clock signal terminal CLK1 and the second clock signal terminal CLK2 of a plurality of shift registers. The clock signals are sequentially and alternately transmitted to the first clock signal terminal CLK1 and the second clock signal terminal CLK2 of the shift register of each stage. That is, the first clock signal is transmitted to the first clock signal terminal CLK1 of the shift register SR1 of the first stage and the second clock signal is transmitted to the second clock signal terminal CLK2 thereof, and the second clock signal is transmitted to the first clock signal terminal CLK1 of the shift register SR2 of the second stage and the first clock signal is transmitted to the second clock signal terminal CLK2 thereof.

The 2-phase clock signals are repeatedly input to the clock signal terminals by changing the transfer pattern for each shift register stage.

An interim output signal that is output by the shift register of the next stage (SR2) is transmitted to the first control signal terminal (UPN) and the second control signal terminal (DNN) of the shift register of the previous stage (SR1).

That is, the first interim output signal generated by the first interim output signal terminal (UP) of the shift register SR2 of the second stage is input to the first control signal terminal (UPN) of the shift register SR1 of the first stage. Also, a second interim output signal generated by the second interim output signal terminal (DN) of the shift register SR2 of the second stage is input to the second control signal terminal (DNN) of the shift register SR1 of the first stage.

According to the above-described method, the first interim output signal and the second interim output signal that are generated in the next stage from among a plurality of shift registers included in the driving device are transmitted to the first control signal terminal (UPN) and the second control signal terminal (DNN) of the corresponding stage.

Each of a plurality of shift registers of the driving device according to an exemplary embodiment of the present invention includes a first interim output signal terminal (UP) for outputting a first interim output signal generated by a first driver, a second interim output signal is terminal (DN) for outputting a second interim output signal generated by the second driver, and an output signal terminal (OUT) for outputting an output signal of a shift register of a corresponding stage by receiving the first interim output signal and the second interim output signal from a buffer.

That is, the shift register SR1 of the first stage is driven by the signals supplied by the input terminals to generate the first interim output signal and the second interim output signal and finally generate an output signal (OUT) of the shift register SR1 of the first stage.

In this instance, as an interim process, the first interim output signal is transmitted to the first input signal terminal (FLMUP) of the shift register SR2 of the second stage from the first interim output signal terminal (UP) of the shift register SR1 of the first stage. Further, the second interim output signal is transmitted to the second input signal terminal (FLMDN) of the shift register SR2 of the second stage from the second interim output signal terminal (DN) of the shift register SR1 of the first stage.

Thenceforth, starting at the second stage, the first interim output signal and the second interim output signal that are generated by the first interim output signal terminal (UP) and the second interim output signal terminal (DN) of each shift register are transmitted to the input signal terminals (FLMUP) and (FLMDN) of the next stage and also to the first control signal terminal (UPN) and the second control signal terminal (DNN) of the previous stage.

The block diagram of a plurality of shift registers of the driving device shown in FIG. 2 is an exemplary embodiment.

Referring to FIG. 2, an interface of the driving device can be simplified by using the 2-phase clock signals. The circuit configuration is simple to generate driving signals with various timings required by the large panel, and economical circuit design is realized.

Figure 3A:
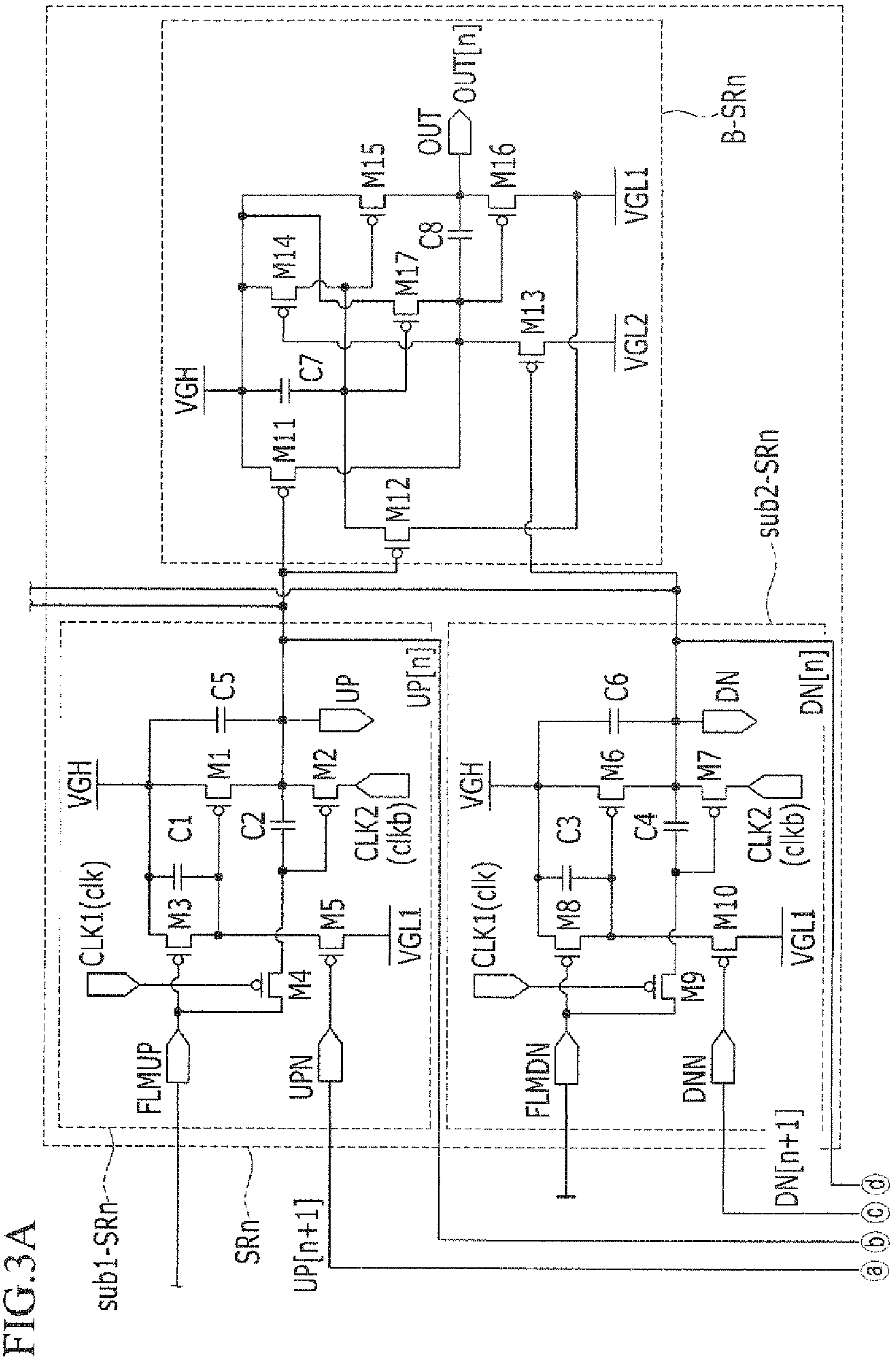
FIGS. 3A and 3B shows a circuit diagram of one of a scan driver and a light emission control driver shown in FIG. 2 according to an exemplary embodiment of the present invention.
Figure 3B:
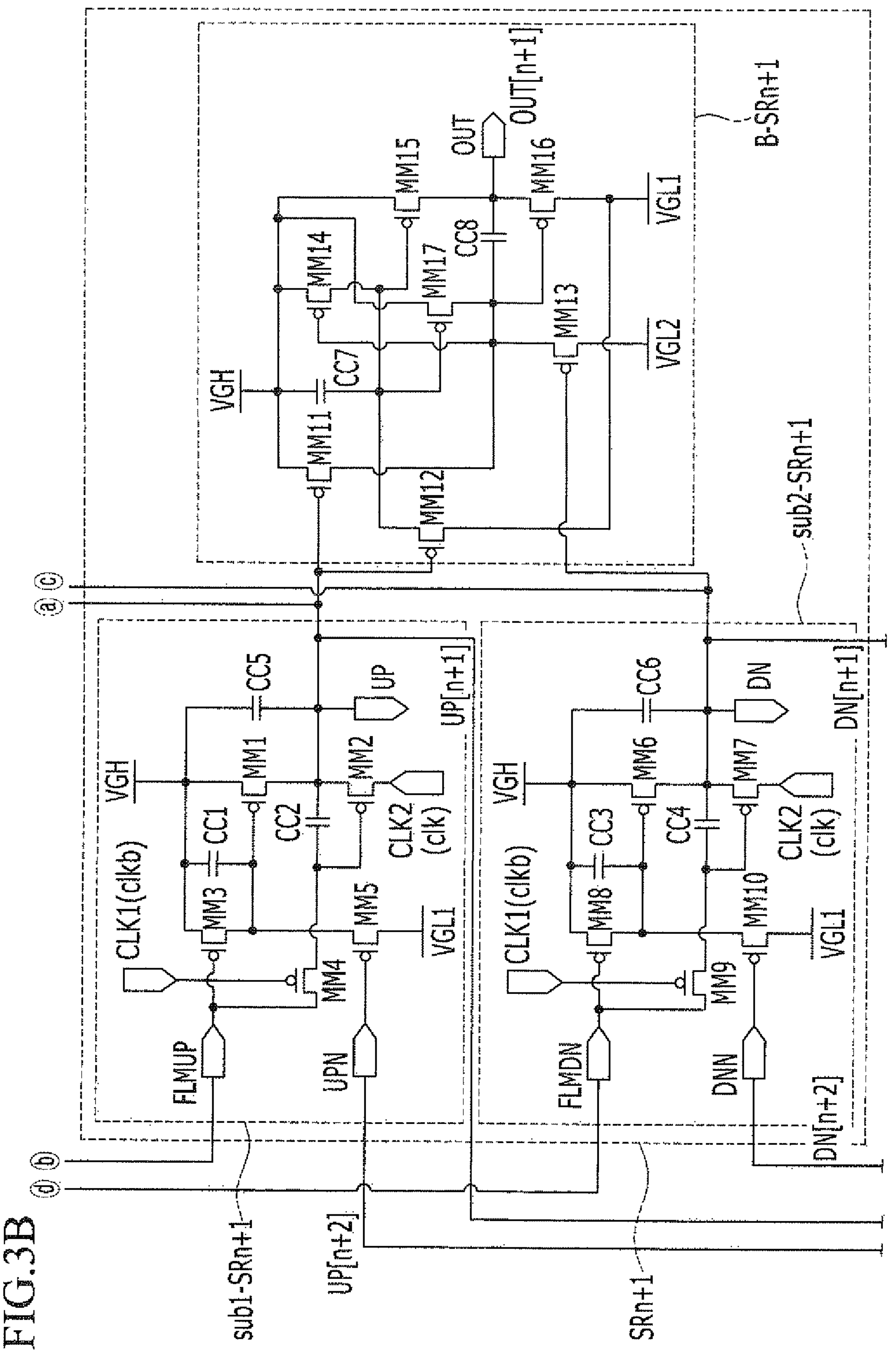

FIGS. 3A and 3B shows a detailed circuit diagram of a driving device according to an exemplary embodiment of the present invention described with reference to the block diagram of FIG. 2. The circuit diagrams of FIGS. 3A and 3B are applicable to a display device configuration such as a scan driver or a light emission control driver according to timing control of driving signals generated by a driving device.

FIG. 3A shows an n-th shift register (SRn) from among a plurality of shift registers of a driving device of FIG. 2, and FIG. 3B shows a (n+1)-th shift register (SRn+1).

In FIG. 3A, the n-th shift register (SRn) includes a first driver (sub1-SRn) and a second driver (sub2-SRn), and also includes a buffer (B-SRn) for generating an output signal (OUT[n]) of the n-th shift register in response to the interim output signal output by the sub-circuit.

In a like manner, in FIG. 3B, the (n+1)-th shift register (SRn+1) includes a first driver (sub1-SRn+1) and a second driver (sub2-SRn+1), and also includes a buffer (B-SRn+1) for generating an output signal (OUT[n+1]) of the (n+1)-th shift register in response to the interim output signal output by the sub-circuit.

In FIG. 3A, the first driver (sub1-SRn) of the n-th shift register (SRn) receives, depending on the position of the n-th shift register (SRn), either the first input signal (flump) or a first interim output signal from the (n−1)-th shift register (SRn−1, not shown) at the first input signal terminal (FLMUP), and generates a first interim output signal (UP[n]) of the n-th stage. In this instance, the first interim output signal (UP[n]) is transmitted to the first input signal terminal (FLMUP) of the first driver (sub1-SRn+1) of the (n+1)-th shift register (SRn+1) shown in FIG. 3B, and is simultaneously transmitted to the buffer (B-SRn) of the n-th stage.

Further, the second driver (sub2-SRn) of the n-th shift register (SRn) receives, depending on the position of the n-th shift register (SRn), either the second input signal (flmdn) or a second interim output signal from the (n−1)-th shift register (SRn−1, not shown) at the second input signal terminal (FLMDN) to generate a second interim output signal (DN[n]) of the n-th stage. In this instance, the second interim output signal (DN[n]) is transmitted to the second input signal terminal (FLMDN) of the second driver (sub2-SRn+1) of the (n+1)-th shift register (SRn+1) shown in FIG. 3B, and is simultaneously transmitted to the buffer (B-SRn) of the n-th stage.

The buffer (B-SRn) of the n-th shift register (SRn) is driven in response to the first interim output signal (UP[n]) and the second interim output signal (DN[n]), and finally generates an output signal (OUT[n]) of the n-th stage.

When the first driver (sub1-SRn) of the n-th shift register (SRn) generates the first interim output signal (UP[n]), the first clock signal (clk) transmitted to the first clock signal terminal CLK1 and the second clock signal (clkb) transmitted to the second clock signal terminal CLK2 are used. Also, the first interim output signal (UP[n+1]) of the shift register (SRn+1) of the next stage transmitted to the first control signal terminal (UPN) is used.

In a like manner, when the second driver (sub2-SRn) of the n-th shift register (SRn) generates the second interim output signal (DN[n]), the first clock signal (clk) transmitted to the first clock signal terminal CLK1 and the second clock signal (clkb) transmitted to the second clock signal terminal CLK2 are used. Further, the second interim output signal (DN[n+1]) of the shift register (SRn+1) of the next stage transmitted to the second control signal terminal (DNN) is used.

A circuit configuration of the (n+1)-th shift register (SRn+1) of FIG. 3B connected to the n-th shift register (SRn) is not much different from that of the n-th shift register (SRn), but the second clock signal (clkb) is transmitted to the first clock signal terminal CLK1 and the first clock signal (clk) is transmitted to the second clock signal terminal CLK2.

A plurality of shift registers having the same circuit configuration alternately receive the 2-phase clock signals that are input to the clock signal terminals to finally generate an output signal.

A detailed circuit diagram of the n-th shift register (SRn) of FIG. 3A will now be described.

The n-th shift register (SRn) includes transistors M1 to M17 and capacitors C1 to C8.

In the first driver (sub1-SRn) of the n-th shift register (SRn), the transistor M1 includes a source electrode connected to a high-potential first power source voltage (VGH), a gate electrode connected to a drain electrode of a transistor M3 and a first end of a first capacitor C1, and a drain electrode connected to interim output terminal (UP).

When turned on, the transistor M1 outputs a high-potential voltage value of the first power source voltage (VGH) as the first interim output signal (UP[n]) of the first interim output signal terminal (UP).

The transistor M2 includes a gate electrode connected to a first end of the second capacitor C2, a drain electrode connected to a second end of the second capacitor C2 and a source electrode connected to the second clock signal terminal CLK2.

When turned on, the transistor M2 receives the second clock signal (clkb) through the second clock signal terminal CLK2 and outputs a first interim output signal (UP[n]) with the corresponding voltage value.

The transistor M3 includes a source electrode connected to the first power source voltage (VGH), a gate electrode connected to a first input signal terminal (FLMUP) and receiving a first interim output signal of a previous stage, and a drain electrode connected to the gate electrode of the transistor M1.

The transistor M4 includes a gate electrode connected to the first clock signal terminal CLK1 and receiving the first clock signal (clk), a source electrode connected to the first input signal terminal (FLMUP) and receiving the first interim output signal of the previous stage, and a drain electrode connected to a gate electrode of the transistor M2 and transmitting an electrode value of the first input signal terminal (FLMUP) and temporarily storing the same in the second capacitor C2.

The first clock signal terminal CLK and the second clock signal terminal CLK2 are connected to the gate electrode of the transistor M4 and the source electrode of the transistor M2, and the clock signals are input, and without being restricted to the exemplary embodiment, the configuration of the clock signal terminals and types of the clock signals transmitted to the corresponding clock signal terminals can be diversified.

The transistor M5 includes a source electrode connected to a low-potential second power source voltage VGL1, a gate electrode connected to a first control signal terminal (UPN) for receiving a first interim output signal (UP[n+1]) of the shift register (SRn+1) of the next stage, and a source electrode source electrode to the gate electrode of the transistor M1.

The second driver (sub2-SRn) of the n-th shift register (SRn) has a similar configuration of the first driver, and the transistors M1 to M5 correspond to the transistors M6 to M10, while the first capacitor C1 and the second capacitor C2 correspond to the third capacitor C3 and the fourth capacitor C4.

If needed, the first driver or the second driver of the n-th shift register (SRn) may further include a fifth capacitor C5 or a sixth capacitor C6 between the interim output terminal (UP or DN) and the first power source voltage (VGH).

The buffer (B-SRn) of the n-th shift register (SRn) generates an output signal (OUT[n]) in correspondence to the first interim output signal (UP [n]) transmitted by the first driver (sub1-SRn) or the second interim output signal (DN[n]) transmitted by the second driver (sub2-SRn).

The buffer (B-SRn) includes transistors M11 to M17, a seventh capacitor C7, and an eighth capacitor C8.

The transistor M11 includes a gate electrode connected to the first interim output signal terminal (UP) and receiving the first interim output signal (UP[n]), a source electrode connected to a high-potential first power source voltage (VGH), and a drain electrode connected to a gate electrode of the transistor M16.

The transistor M12 includes a gate electrode connected to the first interim output signal terminal (UP) and receiving the first interim output signal (UP[n]), a source electrode connected to a low-potential second power source voltage VGL1, and a drain electrode connected to a gate electrode of the transistor M15.

The transistor M13 includes a gate electrode connected to the second interim output signal terminal (DN) and receiving the second interim output signal (DN[n]), a source electrode connected to a third power source voltage VGL2 of a voltage that is less than the second power source voltage VGL1, and a drain electrode connected to the gate electrode of the transistor M16 and a gate electrode of the transistor M14.

The transistor M14 includes a gate electrode connected to the drain electrode of the transistor M13, a source electrode connected to a high-potential first power source voltage (VGH), and a drain electrode connected to the gate electrode of the transistor M15.

The transistor M15 includes a gate electrode connected to the drain electrode of the transistor M14 and the drain electrode of the transistor M12, a source electrode connected to a high-potential first power source voltage (VGH), and a drain electrode connected to an output terminal (OUT) and the drain electrode of the transistor M16.

The transistor M16 includes a gate electrode connected to the drain electrode of the transistors M11 and M13, and further connected to a drain electrode of the transistor M17, a source electrode connected to the low-potential second power source voltage VGL1, and a drain electrode connected to the output terminal (OUT) and the drain electrode of the transistor M15.

The transistor M17 includes a gate electrode connected to the drain electrode of the transistor M12, a source electrode connected to the first power source voltage (VGH), and a drain electrode connected to the gate electrode of the transistor M16.

Also, a first end of the seventh capacitor C7 is connected to the high-potential first power source voltage (VGH), and a second end thereof is connected to a common node between the gate electrodes of the transistors M15 and M17.

The eighth capacitor C8 diode-connects the gate electrode and the drain electrode of the transistor M16 and temporarily stores the voltage transmitted to the transistor M16.

The buffer (B-SRn+1) of the (n+1)-th shift register (SRn+1) shown in FIG. 3B includes transistors MM11 to MM17, a capacitor CC7 and a capacitor CC8 and has the same configuration as transistors M11 to M17, capacitor C7 and capacitor C8 of buffer (B-SRn) of FIG. 3A and will not be described.

In FIG. 3A, the first driver (sub1-SRn) of the n-th shift register (SRn) receives, depending on the position of the n-th shift register (SRn), either the first input signal (flump) or a first interim output signal from the (n−1)-th shift register (SRn−1, not shown) at the first input signal terminal (FLMUP). Further, the second driver (sub2-SRn) of the n-th shift register (SRn) receives, depending on the position of the n-th shift register (SRn), either the second input signal (flmdn) or a second interim output signal from the (n−1)-th shift register (SRn−1, not shown) at the second input signal terminal (FLMDN).

In FIG. 3A, when the first input signal (flmup) of the first driver (sub1-SRn) and the first clock signal (clk) are synchronized to be input as a low level pulse, the second capacitor C2 is changed with the low voltage to turn on the transistor M2 and the transistor M3, and the high-level first power source voltage (VGH) is transmitted to the transistor M1 to be turned off. Therefore, when the voltage level of the second clock signal (clkb) becomes low, the first interim output signal (UP [n]) becomes the low level, and when the voltage level of the second clock signal (clkb) becomes high, the second capacitor C2 is discharged and the first interim output signal (UP[n]) is output as the high level without being influenced by the second clock signal (clkb). When the transistor M1 is turned on, the output of the first interim output signal (UP[n]) is maintained at high.

In a like manner, when the second input signal (flmdn) of the second driver (sub2-SRn) and the first clock signal (clk) are synchronized to be input as a low level pulse, the fourth capacitor C4 is changed with the low voltage to turn on the transistor M7 and the transistor M8, and the high-level first power source voltage (VGH) is transmitted to the transistor M6 to be turned off. Therefore, when the voltage level of the second clock signal (clkb) becomes low, the second interim output signal (DN[n]) becomes low level, and when the voltage level of the second clock signal (clkb) becomes high, the fourth capacitor C4 is discharged to be output as a high level without being influenced by the second clock signal (clkb). When the transistor M6 is turned on, the output of the second interim output signal (DN[n]) is maintained at high.

In the buffer (B-SRn), when the first interim output signal (UP[n]) is low, the transistors M11 and M12 are turned on to turn off the transistor M16, and the transistors M15 and M17 are turned on to output the high-level output signal (OUT[n]) according to the first power source voltage (VGH).

In this instance, the transistor M17 is turned on to additionally apply the high voltage of the first power source voltage (VGH) to the gate electrode of the transistor M16, and the turn-off state of the transistor M16 is maintained long when the output signal (OUT[n]) is high. That is, when the transistor M16 has a high off current, it is operable by the transistor M17 to increase the operational margin and improve the yield. The high level of the output signal is maintained long for a predetermined period in the driving circuit.

When the second driver (sub2-SRn) outputs a low second interim output signal (DN[n]), the transistor M13 is turned on, a third power source voltage VGL2 that is less than the second power source voltage VGL1 is applied to the gate electrode of the transistor M16 to be turned on. Also, the transistor M14 is simultaneously turned on to apply the first power source voltage (VGH) to the gate electrode of the transistor M15 to be turned off.

Therefore, the second power source voltage VGL1 is transmitted through the transistor M16 as the output signal (OUT [n]) to be output as a low level.

That is, to set the low-level period output by the driving device, the second driver (sub2-SRn) is controlled to output the second interim output signal (DN[n]) as the low level.

The voltage value of the third power source voltage VGL2 is not restricted and will be desirable to be less than the second power source voltage VGL1, and it can also have the following condition.

$$VGL2 < VGL1 - 2Vth$$

Here, Vth represents a threshold voltage value of a transistor connected to an output terminal. In the present exemplary embodiment, it means the threshold voltage value of the transistor M16.

Also, the driving circuit adds the third power source voltage VGL2 that is less than the second power source voltage VGL1 to reduce the voltage at the gate electrode of the transistor M16 to be less than the voltage at the source electrode and thereby stably maintain the output voltage. Therefore, the operational margin of the transistor is substantially improved and the yield of the display device using the driving device is improved.

Detailed driving of the driving device shown in FIGS. 3A and 3B following a drive timing diagram of FIG. 4 will now be described. FIGS. 3A and 3B have exemplified the n-th shift register and the (n+1)-th shift register of the driving device, and to describe the timing diagram of FIG. 4, the n-th shift register will be considered the first shift register SR1 of FIG. 2.

Figure 4:
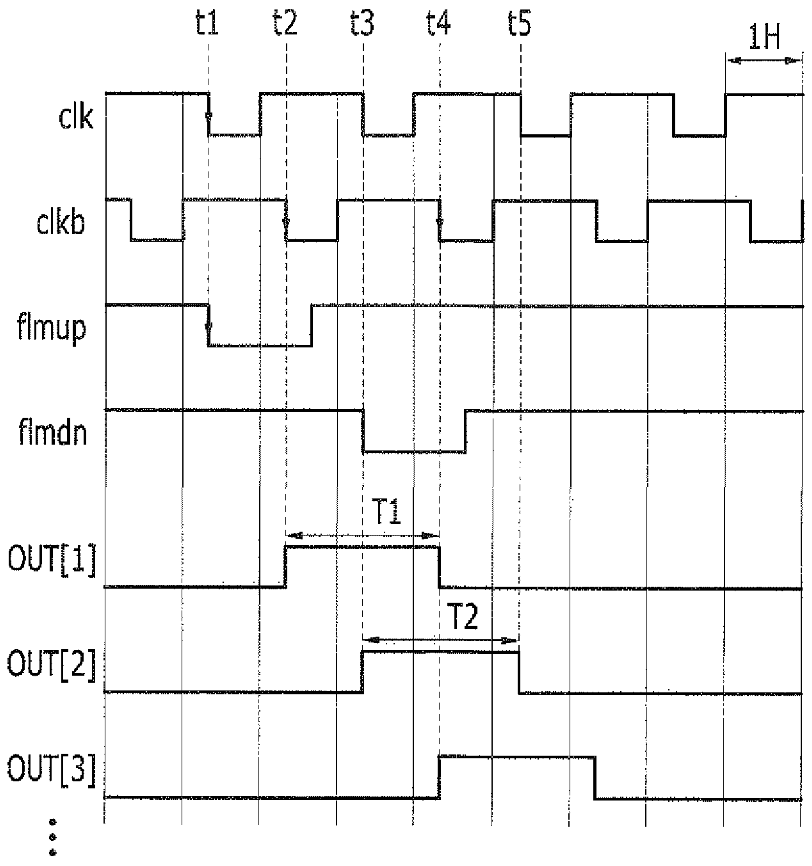
FIG. 4 shows a driving timing diagram of a circuit diagram shown in FIGS. 3A and 3B.

The drive timing diagram of FIG. 4 shows an output signal waveform of a driving device sequentially output by a shift register. The transistors shown in the circuit diagrams of FIGS. 3A and 3B exemplify PMOS transistors, so the signal waveforms of FIG. 4 are operable with reference to the low level pulse.

Referring to FIG. 4, the first clock signal (clk) and the second clock signal (clkb) that are input to the driving device have low-level pulses that are repeated with a predetermined period. The predetermined period is 2 horizontal periods (2H).

Referring to FIG. 4, the first clock signal (clk) and the second clock signal (clkb) have a phase difference of half a period (1H).

FIG. 4 shows a driving waveform of the first shift register in operation from among the is shift registers in the driving device.

At time t1, when the first clock signal (clk) and the start signal (flmup) are synchronized and transmitted as a low level to the first driver (sub1-SR1) of the first shift register SR1, the transistor M2 is turned on and the transistor M1 to which the first power source voltage (VGH) is transmitted is simultaneously turned off. The first interim output signal (UP[n]) is output according to the pulse level of the second clock signal (clkb). Hence, at time t2, a low-level first interim output signal (UP[n]) is output. The low-level first interim output signal (UP[n]) is transmitted to the buffer (B-SR1) to turn on the transistors M11 and M12, the transistor M16 is turned off by the high-potential voltage of the first power source voltage (VGH), and the high-level voltage of the first power source voltage (VGH) is simultaneously generated as an output signal (OUT[n]) of the first shift register through the transistor M15.

In this instance, the voltage at the gate electrode of the transistor M16 is maintained at the high-potential voltage of the first power source voltage (VGH) by simultaneously turning on the transistor M17, and the output signal (OUT[1]) is stably maintained at high level for the period T1.

Accordingly, the driving device can be stably operated in the case of the transistor with a large off current.

When the first clock signal (clk) and another start signal (flmdn) are synchronized and transmitted as low level to the second driver (sub2-SR1) of the first shift register SR1 at time t3, the low-level second interim output signal (DN[n]) is output at time t4. The low-level second interim output signal (DN[n]) is transmitted to the buffer (B-SR1) to turn on the transistor M13, the transistors M14 and M16 are turned on to turn off transmission of the high-level first power source voltage (VGH) through the transistor M15, and a low-level second power source voltage VGL1 is generated as an output signal (OUT[n]). A period T1 of the output signal (OUT[1]) of the first stage is from time t2 to time t4, and follows the period of the second clock signal (clkb). Therefore, a duty ratio of the output signal can be controlled by controlling the period of the second clock signal (clkb).

The period of the output signal shown in FIG. 4 can be controlled by 2NH (N=1, 2 . . . ).

The shift registers of the next stage repeatedly drive to sequentially generate output signals.

In FIG. 4, the first input signal (flmup) of the first driver (sub1-SR1) of the shift register (SR1 in FIG. 2) of the first stage is the first start signal (flmup), and the first input signal (flmup) of the shift register (SR2 in FIG. 2) of the second stage is the first interim output signal (UP[n]) output by the first shift register. In this instance, the first interim output signal (UP[n]) is synchronized with the second clock signal (clbk) and is then transmitted at time t2.

In a like manner, the second input signal (flmdn) that is input to the second driver (sub2-SR2) of the shift register (SR1 in FIG. 2) of the first stage is the second start signal (flmdn), and the second input signal (flmdn) of the shift register (SR2 in FIG. 2) of the second stage is the second interim output signal (DN[n]) output by the first shift register. In this instance, the second interim output signal (DN[n]) is synchronized with the second clock signal (clbk) and is then transmitted at time t4.

The output signal of the second shift register SR2 is switched to a high state in response to the first clock signal (clk) at time t3, and is switched to a low state in response to the first clock signal (clk) at time t5.

The period of the output signals is controllable by controlling the period of the clock signals and a phase difference between the first clock signal and the second clock signal, thereby providing a driving device with the duty ratio that is easy to control.

Also, the embodiment is flexibly applicable to the scan driver and the light emission control driver since various driving timings required by the large-panel display device can be realized.

Figure 5A:
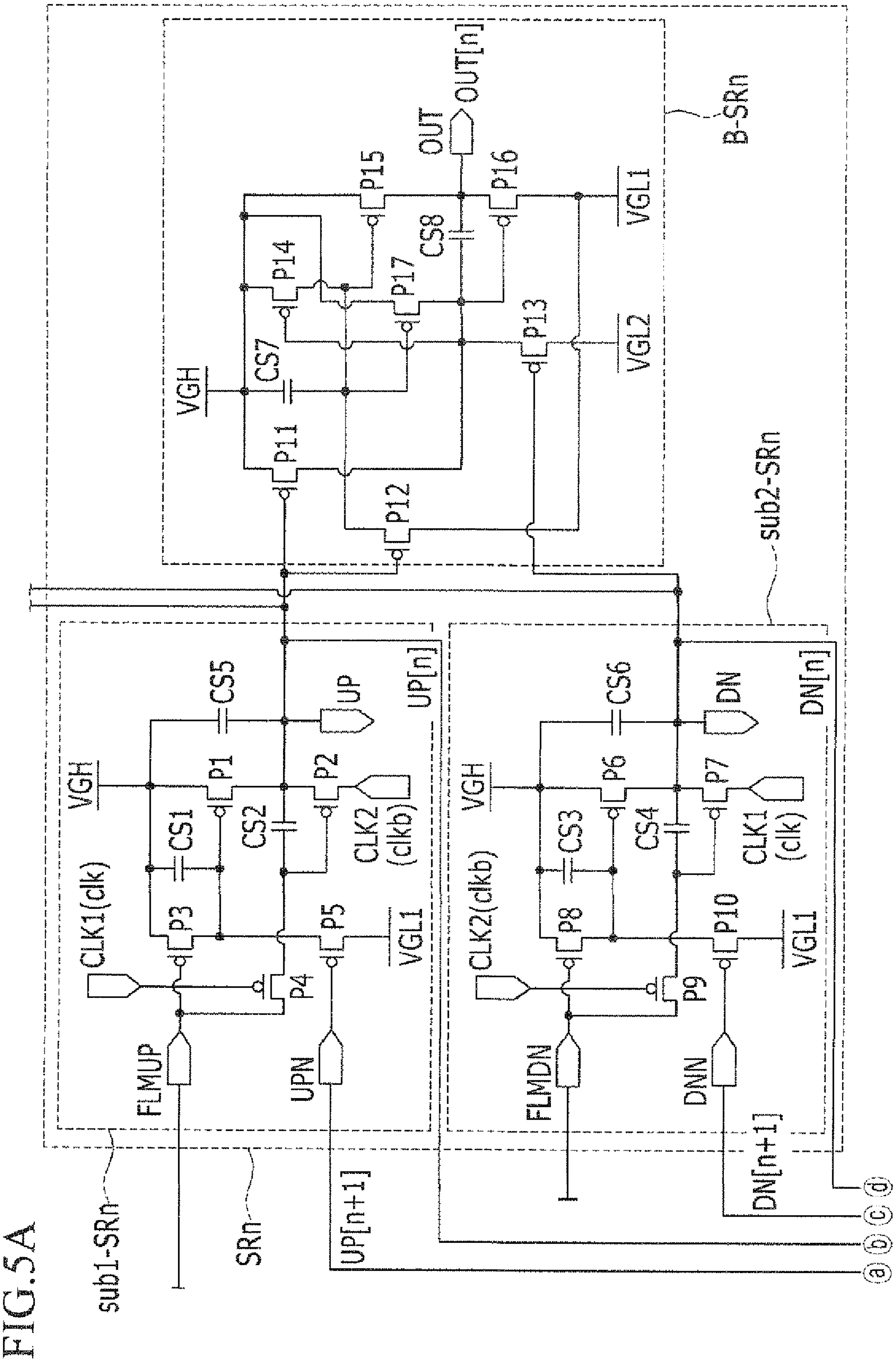
FIGS. 5A and 5B shows a circuit diagram of one of a scan driver and a light emission control driver shown in FIG. 2 according to another exemplary embodiment of the present invention.
Figure 5B:
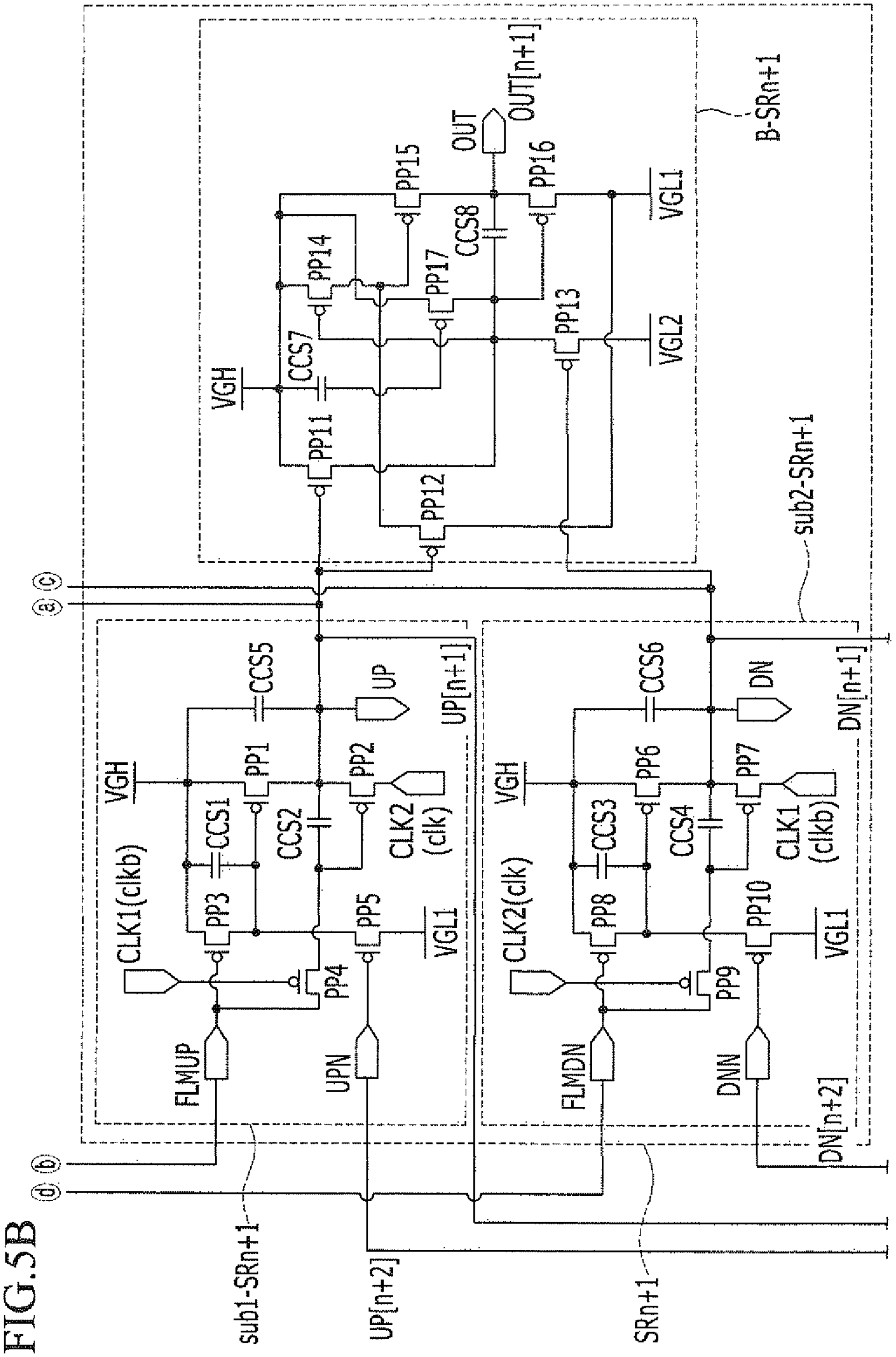
Figure 6:
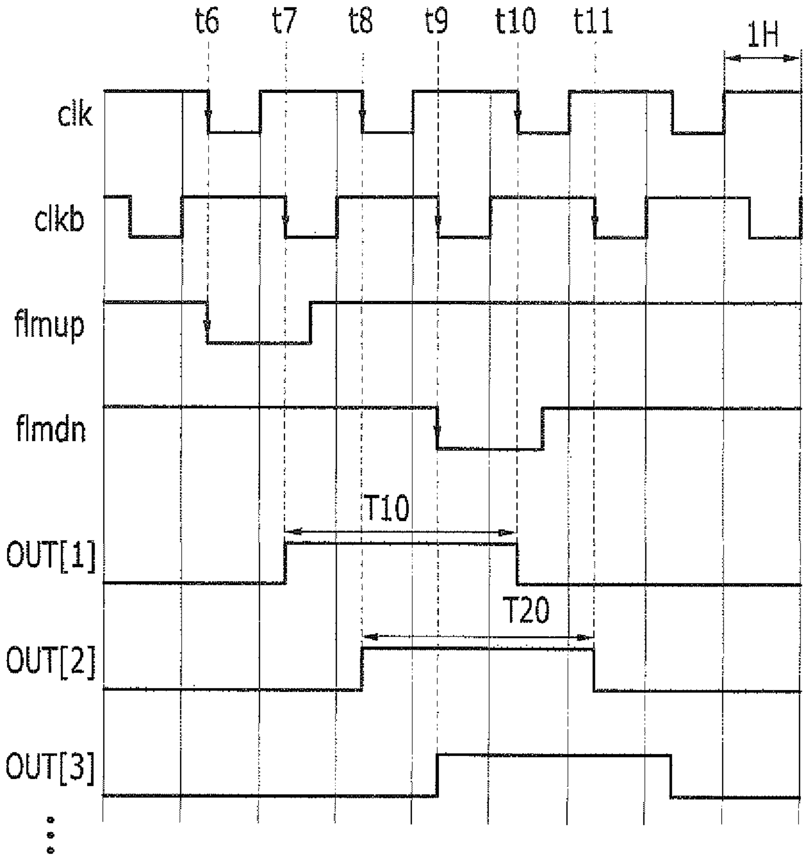
FIG. 6 shows a driving timing diagram of a circuit diagram shown in FIG. 5.

FIGS. 5A and 5B show a circuit diagram of a driving device and FIG. 6 shows a driving timing diagram according to another exemplary embodiment of the present invention, which is very similar to those of the exemplary embodiment described with reference to FIGS. 3A and 3B and FIG. 4, and only different parts will be described in detail.

In FIG. 5A, the n-th shift register (SRn) includes a first driver (sub1-SRn) and a second driver (sub2-SRn), and also includes a buffer (B-SRn) for generating an output signal (OUT[n]) of the n-th shift register in response to the interim output signal output by the sub-circuit. The n-th shift register (SRn) includes transistors P1 to P17 and capacitors CS1 to CS8.

In a like manner, in FIG. 5B, the (n+1)-th shift register (SRn+1) includes a first driver (sub1-SRn+1) and a second driver (sub2-SRn+1), and also includes a buffer (B-SRn+1) for generating an output signal (OUT [n+1]) of the (n+1)-th shift register in response to the interim output signal output by the sub-circuit. The n-th shift register (SRn+1) includes transistors PP1 to PP17 and capacitors CCS1 to CCS8.

In the driving device of FIG. 5A, clock signal terminals of the first driver (sub1-SRn) and the second driver (sub2-SRn) and the types of the clock signals that are input thereto are different from those of FIG. 3A. That is, the disposals of the clock signal terminals of the first driver (sub1-SRn) and the second driver (sub2-SRn) are the same in FIG. 3A, and the disposal of the first clock signal input terminal CLK1 and the second clock signal input terminal CLK2 of the first driver (sub1-SRn) is opposite that of the second driver (sub2-SRn) in FIG. 5A.

Therefore, the first clock signal (clk) is transmitted to the gate terminal of the transistor P4 and the second clock signal (clkb) is transmitted to the source terminal of the transistor P2, while the second clock signal (clkb) is transmitted to the gate terminal of the transistor P9 and the first clock signal (clk) is transmitted to the source terminal of the transistor P7.

In the (n+1)-th shift register (SRn+1), the second clock signal (clkb) is transmitted to the gate terminal of the transistor PP4 and the first clock signal (clk) is transmitted to the source terminal of the transistor PP2, while the first clock signal (clk) is transmitted to the gate terminal of the transistor PP9 and the second clock signal (clkb) is transmitted to the source terminal of the transistor PP7.

The driving device with the above-described circuit configuration is driven by the method of FIG. 6 to generate output signals. For better understanding and ease of description of FIG. 6, the shift register shown in FIGS. 5A and 5B will be set as the shift registers SR1 and SR2 of the first stage and the second stage, respectively.

Referring to FIG. 6, the first clock signal (clk) and the start signal (flmup) input to the first driver of the shift register of the first stage are synchronized and transmitted as low level at time t6, and the output signal (OUT[1]) of the first stage is changed to a high state at time t7 when the low-level second clock signal (clkb) is transmitted. The second clock signal (clkb) and another start signal (flmdn) that is input to the second driver of the shift register of the first stage are synchronized and are transmitted as a low level at time t9, and the output signal (OUT[1]) of the first stage is switched to be a low state at time t10 when the low-level first clock signal (clk) is transmitted.

The period T10 of the output signal (OUT[1]) of the first stage of the driving device having the circuit configuration according to an exemplary embodiment shown in FIG. 5A is from time t7 to time t10, and the duty ratio is controlled by controlling the period of the first clock signal (clk) and the second clock signal (clkb) and a phase difference.

The period of the output signal shown in FIG. 6 can be controlled to be 2N+1H, (N=0, 1, 2 . . . ).

Referring to FIG. 6, the shift register SR2 of the second stage shown in FIG. 5B is repeatedly driven to sequentially generate a second output signal (OUT[2]).

The first input signal (flmup) of the first driver (sub1-SR1) of the shift register (SR1 in FIG. 5A) of the first stage is the first start signal (flmup), and the first input signal (flmup) of the shift register (SR2 in FIG. 5B) of the second stage is the first interim output signal (UP[n]) output by the first shift register. In this instance, the first interim output signal (UP[n]) is transmitted in synchronization with the second clock signal (clkb) at time t7.

In a like manner, the second input signal (flmdn) that is input to the second driver (sub2-SR2) of the shift register (SR1 in FIG. 5A) of the first stage is the second start signal (flmdn), and the second input signal (flmdn) of the shift register (SR2 in FIG. 5B) of the second stage is the second interim output signal (DN[n]) output by the first shift register. In this instance, the second interim output signal (DN[n]) is transmitted in synchronization with the first clock signal (clb) at time t10.

The output signal of the second shift register SR2 is switched to a high state in response to the first clock signal (clk) at time t8, and it is switched to a low state in response to the second clock signal (clkb) at time t11.

The period T20 of the second output signal (OUT[2]) of the first stage of the driving device having the circuit configuration according to an exemplary embodiment shown in FIG. 5A is from time t8 to time t11.

Similarly, a subsequent output signal (OUT[3]) of the first stage of the driving device is from time t9 to time t11.

Figure 7:
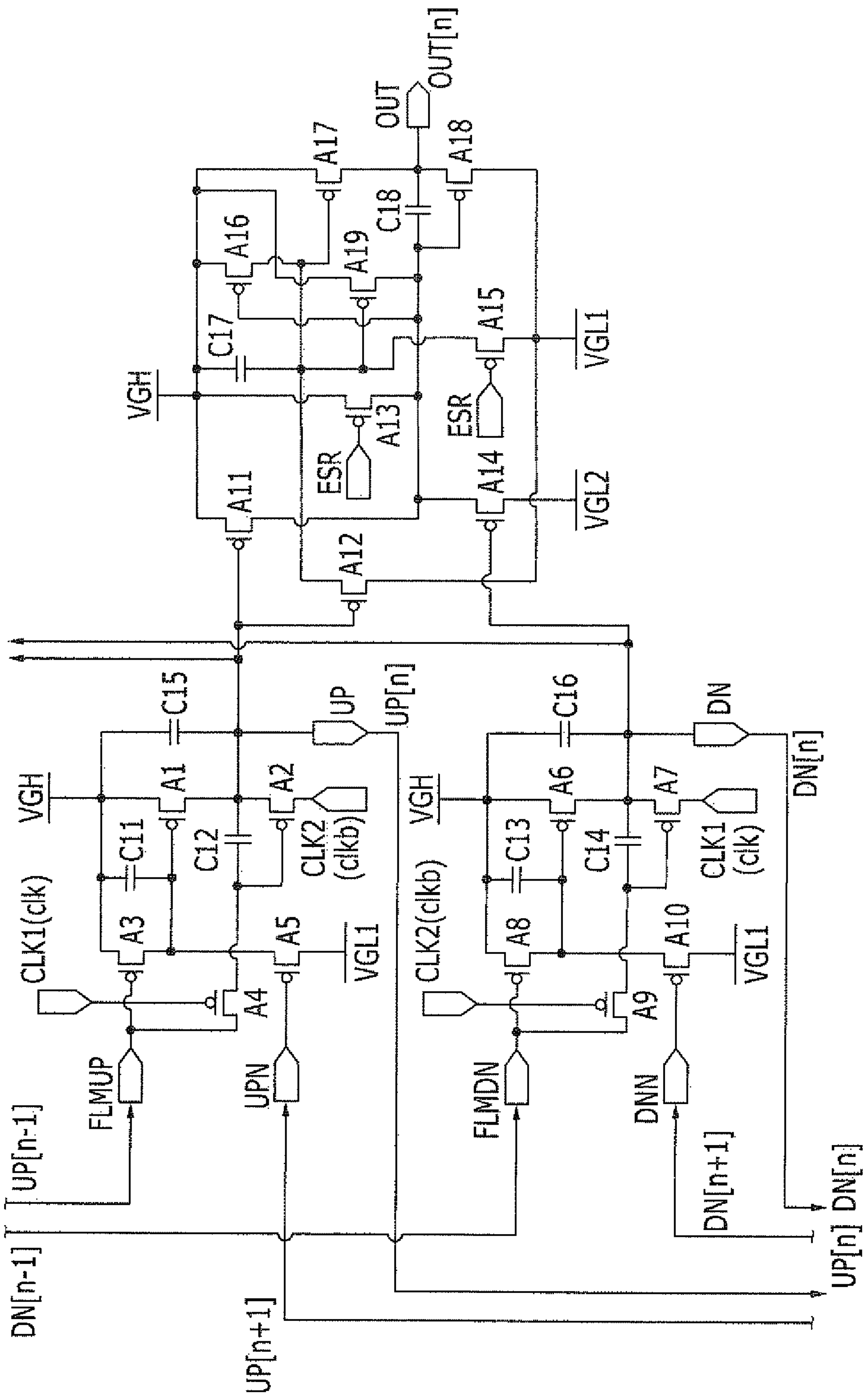
FIG. 7 shows a circuit diagram of one of a scan driver and a light emission control driver shown in FIG. 2 according to yet another exemplary embodiment of the present invention.
Figure 8:
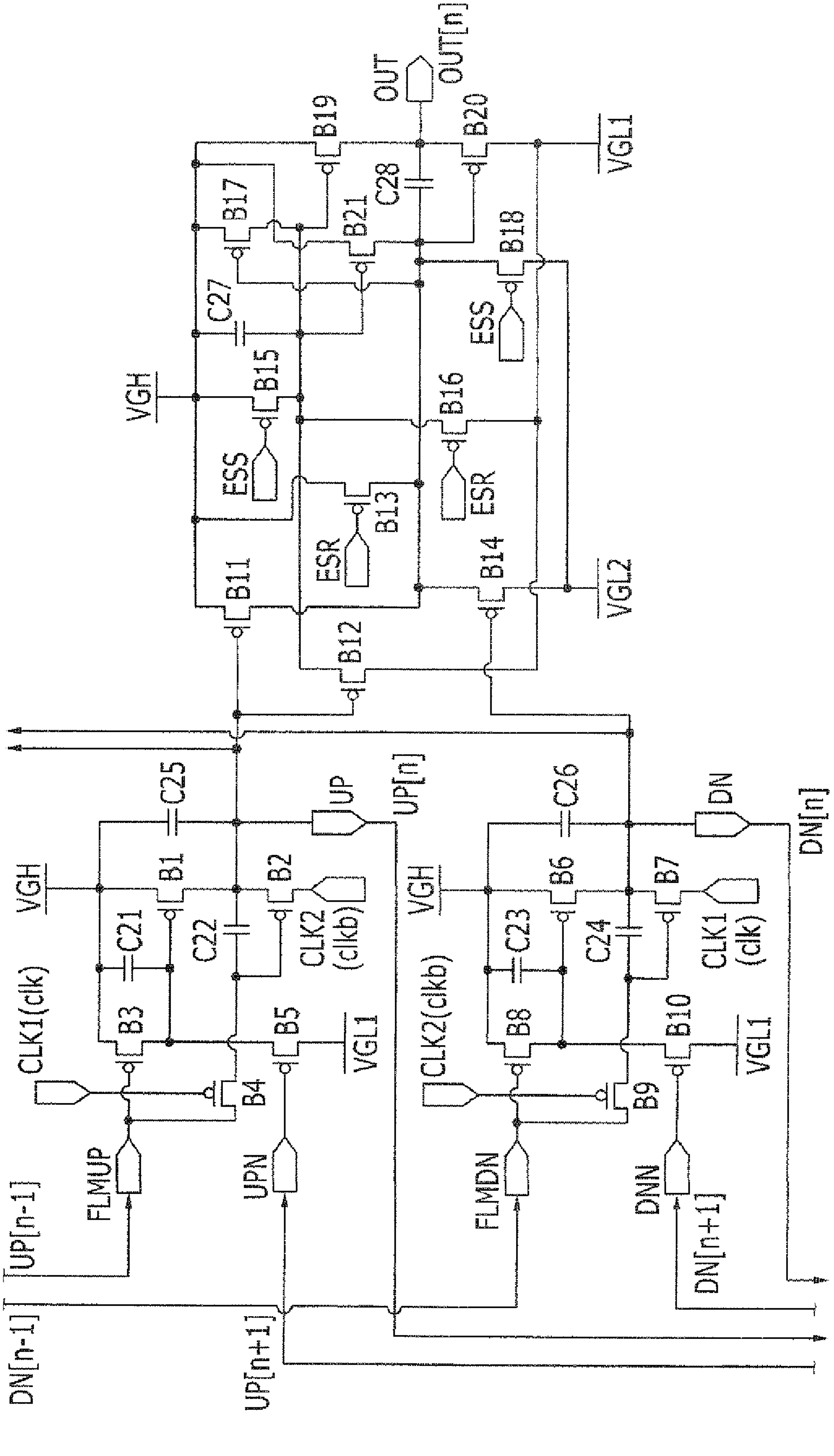
FIG. 8 shows a circuit diagram of one of a scan driver and a light emission control driver shown in FIG. 2 according to a further exemplary embodiment of the present invention.

FIG. 7 and FIG. 8 show circuit diagrams of a driving device according to the other exemplary embodiment of the present invention.

The circuit diagrams of FIG. 7 and FIG. 8 show a shift register corresponding to one end for better understanding and ease of description, and the mutual relationship for the input and output signals of the shift register of the second end is the same as described above.

FIG. 7 and FIG. 8 show a circuit for the light emission control driver 40 particularly applicable to the 3D stereoscopic image display device, available for concurrent light emission or sequential light emission for 3D realization. The concurrent light emitting mode controls an on voltage level and an off voltage level of the light emission control signal in order for all the pixels included in the display 10 to emit light according to the stored data signal.

Referring to FIG. 7, the configuration and operation of the first driver or the second driver of the n-th shift register corresponds to those of the driving device circuit of FIG. 5A. The configuration of the first driver or the second driver shown in FIG. 7 can be designed as that shown in FIG. 3A.

The n-th shift register of FIG. 7 includes transistors A1 to A19 and capacitors C11 to C18.

FIG. 7 shows a different configuration and operation of the buffer, and a transistor A13 is added between the first power source voltage (VGH) and a gate terminal of the transistor A18. Also, a transistor A15 is further added between the second power source voltage VGL1 and a common node of the gate electrodes of the transistors A17 and A19 and the drain electrode of the transistor A12.

The transistor A13 and the transistor A15 receive a first drive control signal (ESR) through the gate electrodes.

In detail, the transistor A13 includes a gate electrode connected to a terminal for transmitting the first drive control signal (ESR), a source electrode connected to the first power source voltage (VGH), and a drain electrode connected to the gate terminal of the transistor A18.

Further, the transistor A15 includes a gate electrode connected to a terminal for transmitting the first drive control signal (ESR), a source electrode connected to the second power source voltage VGL1, and a drain electrode connected to a common node of the gate electrodes of the transistors A17 and A19 and the drain electrode of the transistor A12.

Therefore, the first drive control signal (ESR) is supplied to the transistor A13 and the transistor A15 to control the switching operation.

While the first drive control signal (ESR) is applied as a low level, the transistor A13 and the transistor A15 are turned on to turn off the transistor A18 and simultaneously turn on the transistors A17 and A19 and maintain the output signal (OUT[n]) at a high level. In this instance, the output signal is stably generated since the transistor A19 turns off the transistor A18 when the transistor A18 has a large off current.

Since the transistor A13 and the transistor A15 are turned off while the first drive control signal (ESR) is applied at a low level, the buffer generates high-level and low-level output signals (OUT[n]) when the first interim output signal (UP[n]) and the second interim output signal (DN[n]) supplied by the first driver and the second driver are low level.

Accordingly, the light emission control driver 40 to which the driving device circuit according to an exemplary embodiment of FIG. 7 transmits light emission control signals of the high-level pulse to the pixels while maintaining the first drive control signal (ESR) at a low level, and thereby controls light emission of the pixels while the data signals are written. In this instance, when the transistors of the pixel 60 of the display device are PMOS transistors, a circuit for generating high-level light emission control signals will be provided to control light emission, and without being restricted to this, other exemplary embodiments with different circuit designs depending on the types of the transistors of the pixels are applicable.

The light emission control driver 40 of FIG. 7 outputs light emission control signals with the controlled duty ratio according to the driving process of the driving device while the first drive control signal (ESR) is maintained at a high level.

Differing from the light emission control driver 40 of FIG. 7, a light emission control driver for generating a light emission control signal applicable to the sequential light emitting mode and the concurrent light emitting mode is shown in FIG. 8 as another exemplary embodiment.

FIG. 8 shows another configuration and operation of the buffer, and it can configure a shift register by combining with the sub-circuit according to the exemplary embodiment of FIG. 3A and FIG. 5A.

The n-th shift register of FIG. 8 includes transistors B1 to B21 and capacitors C21 to C28.

In FIG. 8, the buffer further includes four additional transistors compared to the circuit diagram of FIG. 3A or FIG. 5A.

That is, a transistor B13 is added between the first power source voltage (VGH) and a gate terminal of the transistor B20. A transistor B15 is further added between the first power source is voltage (VGH) and a common node of gate electrodes of transistors B19 and B21 and a drain electrode of a transistor B12.

A transistor B16 is added between the second power source voltage VGL1 and a common node of gate electrodes of transistors B19 and B21 and the drain electrode of the transistor B12. A transistor B18 is added between the third power source voltage VGL2 having a voltage value that is less than the second power source voltage VGL1 and a gate terminal of a transistor B20.

The transistors B13 and B16 receive a first drive control signal (ESR) at the gate electrode, respectively, and the transistors B15 and B18 respectively receive a second drive control signal (ESS) at the gate electrode.

In detail, the transistor B13 includes a gate electrode connected to a terminal to which the first drive control signal (ESR) is transmitted, a source electrode connected to the first power source voltage (VGH), and a drain electrode connected to the gate terminal of the transistor B20.

Also, the transistor B15 includes a gate electrode connected to a terminal to which the second drive control signal (ESS) is transmitted, a source electrode connected to the first power source voltage (VGH), and a drain electrode connected to a common node of the gate electrodes of the transistors B19 and B21 and the drain electrode of the transistor B12.

The transistor B16 includes a gate electrode connected to a terminal to which the first drive control signal (ESR) is transmitted, a source electrode connected to the second power source voltage VGL1, and a drain electrode connected to a common node of the gate electrodes of the transistors B19 and B21 and the drain electrode of the transistor B12.

The transistor B18 includes a gate electrode connected to a terminal to which the second drive control signal (ESS) is transmitted, a source electrode connected to the third power source is voltage VGL2, and a drain electrode connected to the gate electrode of the transistor B20.

Therefore, the switching operation of the transistors B13, B15, B16 and B18 is controlled by controlling the first drive control signal (ESR) and the second drive control signal (ESS) according to the concurrent or sequential light emitting mode of the display 10.

A detailed driving process of the driving circuit of FIG. 8 will now be described with reference to a timing diagram of FIG. 9.

Figure 9:
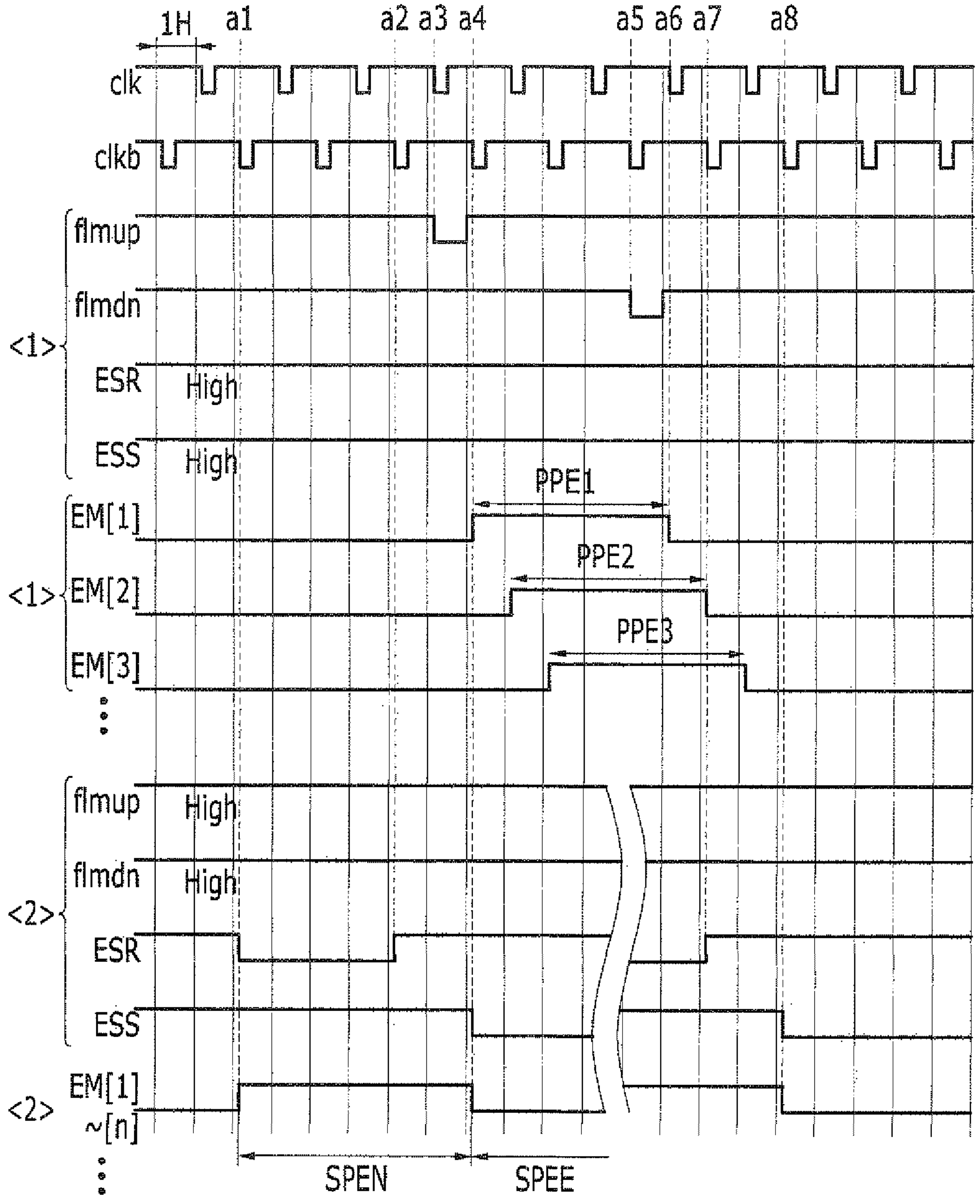
FIG. 9 shows a timing diagram for driving a light emission control driver shown in FIG. 8 according to a sequential light emitting mode or a concurrent light emitting mode of a display device.

FIG. 9 shows a driving timing diagram of the light emission control driver 40 to which a driving circuit of FIG. 8 is applied in the case of the sequential light emitting mode <1> and the case of the concurrent light emitting mode <2>.

The output signal of the light emission control driver 40 output according to the timing of FIG. 9 means a light emission control signal that is a high-level pulse when the transistor for configuring the pixels of the display 10 is a PMOS transistor and emits no light, and that is a low-level pulse when the transistor emits light.

Therefore, in the case of the sequential light emitting mode <1>, the light emission control driver 40 sequentially generates light emission control signals with a phase difference by a predetermined period from the light emission control signal (EM[1]) transmitted to the first pixel line to the light emission control signal (EM[n]) transmitted to the last pixel line.

As similarly described with reference to the circuit shown in FIG. 3A and FIG. 5A, the first clock signal (clk) and the first start signal (flmup) are synchronized at time a3 to be transmitted to the light emission control driver and turn on the transistor B2. At time a4 when the second clock signal (clkb) becomes a low level, the first interim output signal (UP[n]) becomes a low level to be input to the buffer, and the light emission control driver 40 outputs a high-state light emission control signal (EM[1]) to the first pixel line.

In this instance, since the first drive control signal (ESR) and the second drive control signal (ESS) are in a high-level state to turn off the transistors B13, B15, B16, and B18, the light emission control signal (EM[1]) is output at a high level irrespective of the transistors B13, B15, B16, and B18.

The high level voltage of the light emission control signal (EM[1]) does not emit the pixels configured with PMOS transistors, and no light emission caused by the data voltage applied to the pixel during a PPE1 period is performed.

After the PPE1 period has passed, when the second clock signal (clkb) and the second start signal (flmdn) are synchronized and transmitted at a low level at time a5, the transistor B7 is turned on. Then, at time a6 when the first clock signal (clk) becomes a low level, the second interim output signal (DN[n]) becomes a low level to be input to the buffer, and the light emission control driver 40 outputs the low-state light emission control signal (EM[1]) to the first pixel line.

At time a4, the first interim output signal (UP[n]) generated by the first driver of the shift register is transmitted as a low pulse to the first driver of the shift register of the second stage by the second clock signal (clkb), and at time a6, the second interim output signal (DN[n]) generated by the second driver of the shift register is transmitted as a low pulse to the second driver of the shift register of the second stage by the first clock signal (clkb), thereby sequentially generating the light emission control signals.

In this instance, the first drive control signal (ESR) and the second drive control signal (ESS) that are input to the buffer included in the shift register of each stage are maintained at the high-level pulses, and the corresponding transistors are not turned on. Therefore, the duty ratio of the light emission control signal that is output by controlling the period or the pulse of the start signals or the clock signals are controlled in the sequential light emitting mode.

In the case of the non-sequential light emitting mode or the concurrent light emitting mode <2>, the light emission control driver 40 generates the light emission control signals (EM[1]-[n]) and transmits the same to the pixel lines. That is, the pixels of the display 10 having received the light emission control signals (EM[1]-[n]) are suppressed during the non-light-emitting period, and the pixels emit light to be displayed during the light emitting period.

Driving of the light emission control driver 40 for outputting the light emission control signals (EM[1]-[n]) is controlled by the buffer of the shift register.

That is, the first start signal (flmup) and the second start signal (flmdn) are maintained at a high state and the first driver and the second driver of the shift register are not operated. Therefore, the output light emission control signal is controlled by the first drive control signal (ESR) and the second drive control signal (ESS).

That is, at time a1, when the first drive control signal (ESR) is transited to the low level, the transistor B13 and the transistor B16 are turned on. A high-potential first power source voltage (VGH) is transmitted by the transistor B13 to the transistor B20 to be turned off, and a low-potential second power source voltage VGL1 is transmitted by the transistor B16 to the transistors B19 and B21 to be turned on.

The transistor B19 outputs the high-level voltage of the first power source voltage (VGH) as the voltage of the light emission control signals (EM[1]-[n]) that are applied to the pixel lines, and the transistor B21 transmits the high-level voltage of the first power source voltage (VGH) to the transistor B20 so that the circuit may be stably operable to generate the light emission control signals (EM[1]-[n]) when the off current of the transistor B20 is high.

The light emission control signals (EM[1]-[n]) are maintained at the high state from time a1, and are changed to the low state when the first drive control signal (ESR) is transited to the high level at time a2 and the second drive control signal (ESS) is transited to the low state at time a4.

That is, at time a4, when the low-state second drive control signal (ESS) is transmitted to the transistors B15 and B18, the same are turned on. When the transistor B15 is turned on, the high-potential first power source voltage (VGH) turns off the transistors B19 and B21.

When the transistor B18 is turned on, the third power source voltage VGL2 having a voltage that is less than the second power source voltage VGL1 is transmitted to the transistor B20 to output the low-state light emission control signals (EM[1]-[n]) with the low-potential second power source voltage VGL1 level.

Therefore, the duty ratio of the light emission control signals (EM[1]-[n]) is controllable by controlling the period or the pulses of the first drive control signal (ESR) and the second drive control signal (ESS).

The period from time a1 to time a4 represents a non-light-emitting period (SPEN) since the entire light emission control signals (EM[1]-[n]) are output as the high state and all the pixels of the display 10 are in the non-light-emitting state.

At time a4, the light emission control signals (EM[1]-[n]) are transmitted as the low state and the pixels emit light, and the period for maintaining the low state becomes the light emitting period (SPEE).

In the driving circuit, the circuit of the driving device including a transistor (a stabilization transistor) for allowing stable drive when the off current of the transistor connected to the output is terminal is increased will be varied in various forms.

Also, the embodiment is applicable to various other forms including a circuit configuration for separating low-potential power supply so as to control the voltage applied to the gate electrode of the transistor that is connected to the output terminal to be less than the voltage that is applied to the source electrode, and thereby increase the operational margin of the transistor.

In general, the thin film transistor configuring the driving device increases the off current as time is passed, and the driving device including the thin film transistor with a high off current improves the operational margin to increase the yield of the display device including the driving device.

Figure 10:
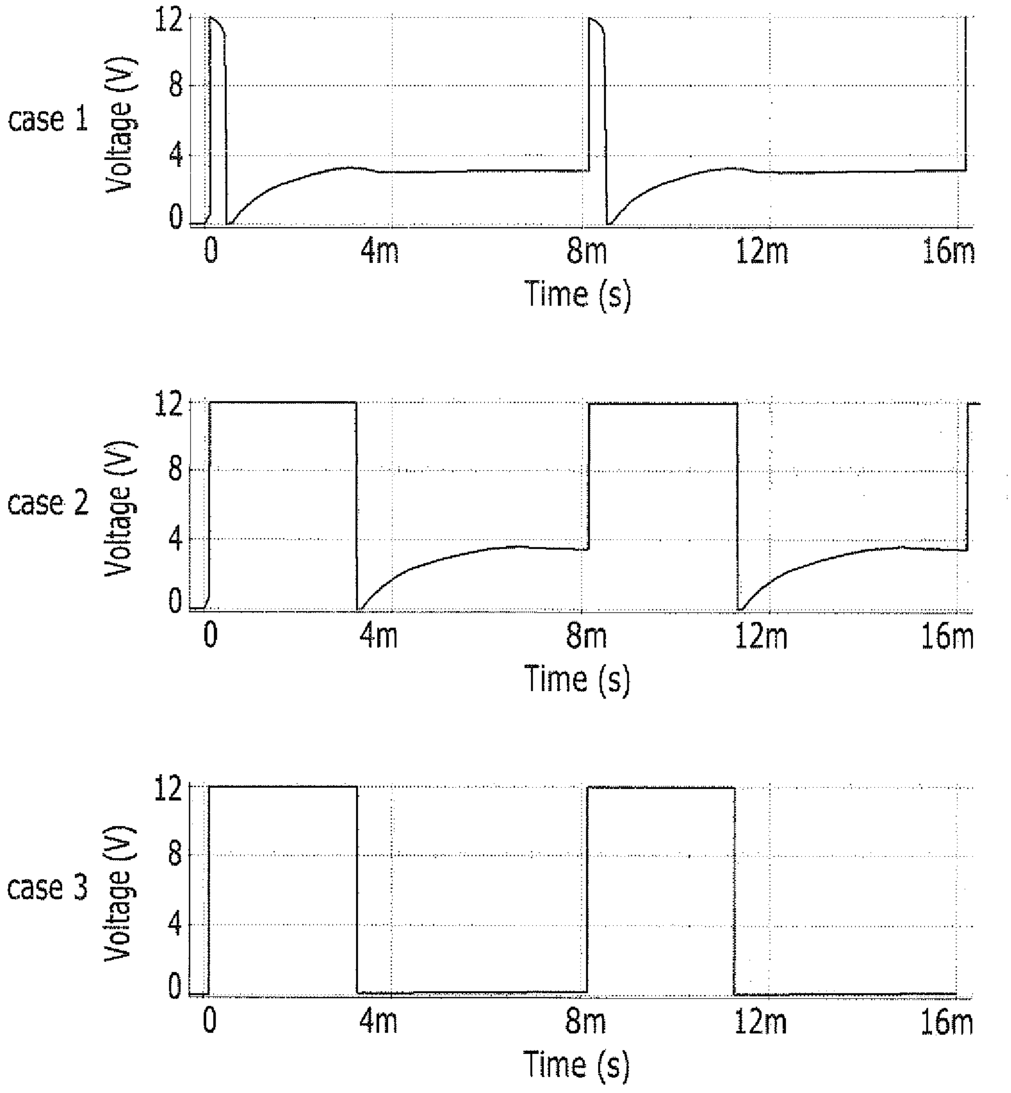
FIG. 10 shows a simulation graph for showing an improved process of a signal waveform generated by a driving device according to an exemplary embodiment of the present invention.

FIG. 10 shows a simulation graph for showing an improved process of a signal waveform output by a driving device according to an exemplary embodiment of the present invention.

Referring to FIG. 10, when the constituent elements according to the embodiment of the present invention are added to the circuit of the driving device, the waveform of the driving signal is generated to be gradually more stable and reliable.

Case 1 shows an unstable waveform in which the driving signal that is output by the driving device including the transistor with a high off current does not maintain the long high state and the low state.

However, when a stabilization transistor is added to the gate electrode of the transistor connected to the output terminal of the driving circuit, the high state of the signal that is output by the driving circuit is maintained for a desired period as shown by Case 2.

As described, this is because the stabilization transistor maintains the off state of the transistor that is connected to the output terminal in a more stable manner and so the high-level voltage is stably output through the output terminal.

When the characteristic of the driving circuit according to an exemplary embodiment of the present invention is applied to the driving circuit of Case 2, the stable output signals shown in Case 3 are generated.

That is, Case 3 shows a waveform of the output signal when the low-potential power source voltage supplied to the driving device to which a stabilization transistor is added is divided. In detail, the voltage difference (Vgs) of the transistor connected to the output terminal is stably maintained by controlling the low-potential power source voltage that is applied to the gate electrode of the transistor that is connected to the output terminal of the driving device to be less than the potential power source voltage that is applied to the source electrode.

Therefore, referring to Case 3, the output signal waveform of the driving device is stably maintained at a high state for a long time and simultaneously the low level voltage is maintained in the low state.

Although the present invention is described with reference to the detailed exemplary embodiments of the present invention, this is by way of example only and the present invention is not limited thereto.

A person of an ordinary skill in the art may change or modify the described exemplary embodiment without departing from the scope of the present invention, and the change or modification are also included in the scope of the present invention. Further, materials of each components described in the present specification are easily selected or replaced from various materials known to a person of ordinary skill in the art. In addition, a person of ordinary skill in the art may omit some of the components described in the present specification without deteriorating the performance or add components in order to improve the performance. Further, a person of ordinary skill in the art may change a sequence of processes described in the present specification according to the process environments or equipment. Therefore, the scope of the present invention should be defined by the appended claims and equivalents, not by the described exemplary embodiments.

What is claimed is:

1. A driving device comprising:

a plurality of shift registers couple in series, each of the shift registers having a first input signal terminal, a second input signal terminal, a first clock signal input terminal, a second clock signal input terminal, a first control signal input terminal, a second control signal input terminal, a first interim output signal terminal, a second interim output signal terminal and an output signal terminal, each of the shift registers including:

a first driver driven by a first input signal input via the first input signal terminal and generating a first interim output signal controlled by a first clock signal;

a second driver driven by a second input signal input via the second input signal terminal and generating a second interim output signal controlled by a second clock signal; and a buffer driven by the first interim output signal and the second interim output signal and generating an output signal output via the output signal terminal, wherein the buffer comprises a first transistor transmitting a voltage from a first voltage source having a first level as the output signal in turn-on time of the first transistor in response to the first interim output signal, a second transistor connected to a gate electrode of the first transistor to transmit a voltage having a second level for turning off the first transistor, and a third transistor having a first electrode connected to a second voltage source having a third level and a second electrode connected to the gate electrode of the first transistor and transmitting a voltage having the third level from the second voltage source in response to the second interim output signal, the third level being less than the first level; and a succeeding one of the shift registers receiving, from the first interim output signal terminal and the second interim output signal terminal of a previous one of the shift registers, the first interim output signal and the second interim output signal, respectively, at its first input signal terminal and its second input signal terminal, the first and second interim output signal terminals of the succeeding one of the shift registers being coupled to the first and second control signal input terminals, respectively, of the previous one of the shift registers.

2. The driving device of claim 1, wherein the third level is less than the first level by at least twice a threshold voltage of the first transistor.

3. The driving device of claim 1, wherein the first level is a low level applied by a low-potential power source voltage.

4. The driving device of claim 1, wherein the output signal is output to be a voltage with an inverted level when the first interim output signal is a gate on voltage level, and it is output to be a voltage with a corresponding level when the second interim output signal is a gate on voltage level.

5. The driving device of claim 1, wherein the output signal is output to be the voltage with the second level when the first interim output signal is transmitted with a gate on voltage level to the buffer, and is output to be the voltage with the first level when the second interim output signal is transmitted with the gate on voltage level to the buffer.

6. The driving device of claim 1, wherein the output signal is controlled by a pulse width or a period of the first clock signal and the second clock signal.

7. The driving device of claim 1, wherein the output signal is generated when the first input signal is transmitted with the gate on voltage level and the first interim output signal is generated in correspondence to a gate on voltage level pulse of the first clock signal, or when the second input signal is transmitted with the gate on voltage level and the second interim output signal is generated in correspondence to a gate on voltage level pulse of the second clock signal.

8. The driving device of claim 1, wherein the first driver and the second driver receive at least two clock signals that are 2-phase clock signals of which phase is inverted for each other.

9. The driving device of claim 1, wherein the first interim output signal is transmitted as a first input signal of a shift register of a next stage.

10. The driving device of claim 1, wherein the second interim output signal is transmitted as a second input signal of a shift register of a next stage.

11. The driving device of claim 1, wherein circuit elements for configuring the first driver, the second driver, and the buffer are a plurality of transistors, and the plurality of transistors are realized with PMOS transistors or NMOS transistors.

12. The driving device of claim 1, wherein the buffer further comprises:

a fourth transistor connected to an output terminal for outputting the output signal and transmitting the voltage with the second level as the output signal.

13. The driving device of claim 12, wherein the second level is a high level applied by a high-potential power source voltage.

14. The driving device of claim 1, wherein the buffer comprises:

a thirteenth switch controllable by the first interim output signal, and transmitting a voltage of the second level to the first transistor;

a fourteenth switch controllable by the first interim output signal, and transmitting a voltage of the first level to the second transistor and a fifteenth switch;

a fifteenth switch controllable by the transmitted voltage of the first level, and transmitting a voltage of the second level to the output signal;

a sixteenth switch controllable by the second interim output signal, and transmitting a voltage with a third level that is less than the first level to the first transistor and a seventeenth switch;

a seventeenth switch controllable by the voltage with the third level and transmitting the voltage of the second level to the fifteenth switch;

a fifth capacitor for storing the voltage transmitted to the gate electrode of the first transistor; and a sixth capacitor for storing the voltage transmitted to the gate electrode of the fifteenth switch, and wherein the first transistor is switched in response to the voltage with the second level or the voltage with the third level, and it outputs the voltage of the first level with the output signal.

15. The driving device of claim 14, wherein the voltage with the third level is transmitted to the first transistor and the seventeenth switch through the third transistor.

16. The driving device of claim 1, wherein the buffer further comprises:

a first driving switch for transmitting the voltage with the second level to the gate electrode of the first transistor in response to the first drive control signal; and a second driving switch for transmitting the voltage with the first level to the gate electrode of the second transistor in response to the first drive control signal.

17. The driving device of claim 16, wherein, while the first drive control signal is transmitted with the gate on voltage level, the first driving switch and the second driving switch are turned on and the buffer generates the voltage with the second level as an output signal.

18. The driving device of claim 1, wherein the buffer further comprises:

a first driving switch for transmitting the voltage with the second level to the gate electrode of the first transistor in response to the first drive control signal;

a second driving switch for transmitting the voltage with the first level to the gate electrode of the second transistor in response to the first drive control signal;

a third driving switch for transmitting the voltage with the second level to the gate electrode of the second transistor in response to the second drive control signal; and a fourth driving switch for transmitting a voltage with a level that is less than the first level to the gate electrode of the first transistor in response to the second drive control signal.

19. The driving device of claim 18, wherein, while the first driver and the second driver of the driving device are turned off, when the first drive control signal is applied with the gate on voltage level, the first driving switch and the second driving switch are turned on and the buffer generates the voltage with the second level as an output signal, and when the second drive control signal is applied with the gate on voltage level, the third driving switch and the fourth driving switch are turned on and the buffer generates the voltage with the first level as an output signal.

20. The driving device of claim 1, wherein the second driver comprises:

a seventh switch controllable by the second clock signal and a second clock bar signal of which phase is inverted corresponding to the second clock signal, and transmitting a voltage caused by a voltage level of the second input signal to the third node;

an eighth switch controllable by the second input signal, and transmitting a first power source voltage to a fourth node;

a ninth switch controllable in correspondence to the voltage transmitted to the third node, and transmitting a voltage caused by a voltage level of the second clock signal with a voltage level of the second interim output signal;

a tenth switch controllable in correspondence to the voltage transmitted to the fourth node, and transmitting the first power source voltage with a voltage level of the second interim output signal;

a third capacitor for storing the voltage transmitted to the third node; and a fourth capacitor for storing the voltage transmitted to the fourth node.

21. The driving device of claim 20, wherein the second driver further comprises at least one twelfth switch controllable by the second power source voltage transmitted to the fourth node, and transmitting the first power source voltage to the third node.

22. The driving device of claim 20, wherein the second driver further comprises an eleventh switch controllable by a second control signal, and transmitting a second power source voltage with a level that is less than that of the first power source voltage to the fourth node.

23. The driving device of claim 22, wherein the second control signal is a second interim output signal generated by a shift register of a next stage.

24. The driving device of claim 1, wherein the first driver comprises:

a first switch controllable by the first clock signal and a first clock bar signal of which phase is inverted corresponding to the first clock signal, and transmitting a voltage caused by a voltage level of the first input signal to a first node;

a second switch controllable by the first input signal and transmitting a first power source voltage to a second node;

a third switch controllable in correspondence to the voltage transmitted to the first node, and transmitting a voltage caused by the voltage level of the first clock signal with a voltage level of the first interim output signal;

a fourth switch controllable in correspondence to the voltage transmitted to the second node and transmitting the first power source voltage with a voltage level of the first interim output signal;

a first capacitor for storing the voltage transmitted to the first node; and a second capacitor for storing the voltage transmitted to the second node.

25. The driving device of claim 24, wherein the first driver further comprises a fifth switch controllable by a first control signal and transmitting a second power source voltage with a level that is less than that of the first power source voltage to the second node.

26. The driving device of claim 25, wherein the first driver further comprises at least one sixth switch controllable by the second power source voltage transmitted to the second node and transmitting the first power source voltage to the first node.

27. The driving device of claim 25, wherein the first control signal is a first interim output signal generated by a shift register of a next stage.

28. A display device comprising:

a display including a plurality of pixels respectively connected to a plurality of scan lines for transmitting a plurality of scan signals, a plurality of data lines for transmitting a plurality of data signals, and a plurality of light emission control lines for transmitting a plurality of light emission control signals;

a scan driver for generating the scan signal and transmitting it to a corresponding scan line from among the plurality of scan lines;

a data driver for transmitting the data signal to the plurality of data lines; and a light emission control driver for generating the light emission control signal and transmitting it to a corresponding light emission control line from among the plurality of light emission control lines, wherein the scan driver or the light emission control driver comprises:

a plurality of shift registers couple in series, each of the shift registers having a first input signal terminal, a second input signal terminal, a first clock signal input terminal, a second clock signal input terminal, a first control signal input terminal, a second control signal input terminal, a first interim output signal terminal, a second interim output signal terminal and an output signal terminal, a first one of the shift registers including:

a first driver driven by the first input signal input via the first input signal terminal and generating a first interim output signal controlled by a first clock signal;

a second driver driven by the second input signal input via the second input signal terminal and generating a second interim output signal controlled by the second clock signal; and a buffer driven by the first interim output signal and the second interim output signal and generating an output signal output via the output signal terminal, wherein the buffer comprises a first transistor transmitting a voltage from a first voltage source having a first level as the output signal in turn-on time of the first transistor in response to the first interim output signal, a second transistor connected to a gate electrode of the first transistor to transmit a voltage having a second level for turning off the first transistor, and a third transistor having a first electrode connected to a second voltage source having a third level and a second electrode connected to the gate electrode of the first transistor and transmitting a voltage having the third level from the second voltage source in response to the second interim output signal, the third level being less than the first level; and a succeeding one of the shift registers receiving, from the first interim output signal terminal and the second interim output signal terminal of a previous one of the shift registers, the first interim output signal and the second interim output signal, respectively, at its first input signal terminal and its second input signal terminal, the first and second interim output signal terminals of the succeeding one of the shift registers being coupled to the first and second control signal input terminals, respectively, of the previous one of the shift registers.

29. The display device of claim 28, wherein the third level is less than the first level by at least twice a threshold voltage of the first transistor.

30. The display device of claim 28, wherein the first level is a low level supplied by a low-potential power source voltage.

31. The display device of claim 28, wherein the output signal is output to be a voltage with an inverted level when the first interim output signal is a gate on voltage level, and it is output to be a voltage with a corresponding level when the second interim output signal is a gate on voltage level.

32. The display device of claim 28, wherein the output signal is output to be the voltage with the second level when the first interim output signal is transmitted with a gate on voltage level to the buffer, and is output to be the voltage with the first level when the second interim output signal is transmitted with the gate on voltage level to the buffer.

33. The display device of claim 28, wherein the output signal is controlled by a pulse width or a period of the first clock signal and the second clock signal.

34. The display device of claim 28, wherein the output signal is generated when the first input signal is transmitted with the gate on voltage level and the first interim output signal is generated in correspondence to a gate on voltage level pulse of the first clock signal, or when the second input signal is transmitted with the gate on voltage level and the second interim output signal is generated in correspondence to a gate on voltage level pulse of the second clock signal.

35. The display device of claim 28, wherein the first driver and the second driver receive at least two clock signals that are 2-phase clock signals of which phase is inverted for each other.

36. The display device of claim 28, wherein the first interim output signal is transmitted as a first input signal of a shift register of a next stage.

37. The display device of claim 28, wherein the second interim output signal is transmitted as a second input signal of a shift register of a next stage.

38. The display device of claim 28, wherein circuit elements for configuring the first driver, the second driver, and the buffer are a plurality of transistors, and the plurality of transistors are realized with PMOS transistors or NMOS transistors.

39. The display device of claim 28, wherein the buffer further comprises:

a fourth transistor connected to an output terminal for outputting the output signal and transmitting the voltage with the second level as the output signal.

40. The display device of claim 39, wherein the second level is a high level supplied by a high-potential power source voltage.

41. The display device of claim 28, wherein the buffer further comprises:

a first driving switch for transmitting the voltage with the second level to the gate electrode of the first transistor in response to the first drive control signal; and a second driving switch for transmitting the voltage with the first level to the gate electrode of the second transistor in response to the first drive control signal.

42. The display device of claim 41, wherein, while the first drive control signal is transmitted with the gate on voltage level, the first driving switch and the second driving switch are turned on and the buffer generates the voltage with the second level as an output signal.

43. The display device of claim 28, wherein the buffer comprises:

a first driving switch for transmitting the voltage with the second level to the gate electrode of the first transistor in response to the first drive control signal;

a second driving switch for transmitting the voltage with the first level to the gate electrode of the second transistor in response to the first drive control signal;

a third driving switch for transmitting the voltage with the second level to the gate electrode of the second transistor in response to the second drive control signal; and a fourth driving switch for transmitting a voltage with a level that is less than the first level to the gate electrode of the first transistor in response to the second drive control signal.

44. The display device of claim 43, wherein, while a first driver and a second driver of the scan driver or the light emission control driver of the display device are turned off, when the first drive control signal is applied with the gate on voltage level, the first driving switch and the second driving switch are turned on and the buffer generates the voltage with the second level as an output signal, and when the second drive control signal is applied with the gate on voltage level, the third driving switch and the fourth driving switch are turned on and the buffer generates the voltage with the first level as an output signal.

45. The display device of claim 43, wherein, when the display of the display device is in a concurrent light emitting mode, the first driver and the second driver of the light emission control driver are turned off, when the first drive control signal is applied with a gate on voltage level, a plurality of light emission control signals are generated with a gate off voltage level to begin a non-light-emitting period, and when the second drive control signal is applied with a gate on voltage level, a plurality of light emission control signals are generated with a gate on voltage level to begin a light emitting period.

* * * * *